United States Patent
Xie et al.

(10) Patent No.: US 10,243,053 B1
(45) Date of Patent: Mar. 26, 2019

(54) GATE CONTACT STRUCTURE POSITIONED ABOVE AN ACTIVE REGION OF A TRANSISTOR DEVICE

(71) Applicant: GLOBALFOUNDRIES Inc., Grand Cayman (KY)

(72) Inventors: Ruilong Xie, Niskayuna, NY (US); Andre Labonte, Mechanicville, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/876,316

(22) Filed: Jan. 22, 2018

(51) Int. Cl.
| | | |
|---|---|---|
| H01L 21/8234 | (2006.01) | |
| H01L 27/088 | (2006.01) | |
| H01L 29/45 | (2006.01) | |
| H01L 29/417 | (2006.01) | |
| H01L 21/28 | (2006.01) | |
| H01L 23/528 | (2006.01) | |
| H01L 29/78 | (2006.01) | |

(52) U.S. Cl.
CPC .. H01L 29/41775 (2013.01); H01L 21/28114 (2013.01); H01L 21/28123 (2013.01); H01L 21/823431 (2013.01); H01L 21/823437 (2013.01); H01L 23/528 (2013.01); H01L 27/0886 (2013.01); H01L 29/785 (2013.01)

(58) Field of Classification Search
CPC ......... H01L 29/41775; H01L 29/41783; H01L 29/785; H01L 23/528; H01L 21/823431; H01L 21/0886; H01L 21/823437; H01L 21/28114
See application file for complete search history.

(56) References Cited

U.S. PATENT DOCUMENTS

| | | | |
|---|---|---|---|
| 9,461,143 B2 | 10/2016 | Pethe et al. | |
| 9,548,366 B1 | 1/2017 | Ho et al. | |
| 9,634,115 B2 * | 4/2017 | Xie | H01L 29/665 |
| 9,741,812 B1 | 8/2017 | Adusumilli et al. | |
| 9,899,321 B1 | 2/2018 | Park et al. | |
| 2018/0138176 A1 | 5/2018 | Shen et al. | |

OTHER PUBLICATIONS

Notice of Allowance from related U.S. Appl. No. 15/709,704 dated Sep. 25, 2018.
Office Action from related U.S. Appl. No. 15/709,671 dated Jul. 16, 2018.

* cited by examiner

*Primary Examiner* — Hsien Ming Lee
(74) *Attorney, Agent, or Firm* — Amerson Law Firm, PLLC

(57) ABSTRACT

One illustrative IC product disclosed herein includes a gate structure for a transistor, a conductive source/drain contact structure and an insulating source/drain cap structure positioned above the conductive source/drain contact structure, wherein the insulating source/drain cap structure has a first notch formed therein. In one illustrative example, the product also includes a sidewall spacer that has a second notch in an upper portion of the sidewall spacer, wherein a first portion of the insulating source/drain cap structure is positioned in the second notch, and a conductive gate contact structure comprising first and second portions, the first portion of the conductive gate contact structure being positioned in the first notch and the second portion of the conductive gate contact structure being in contact with the gate structure.

20 Claims, 37 Drawing Sheets

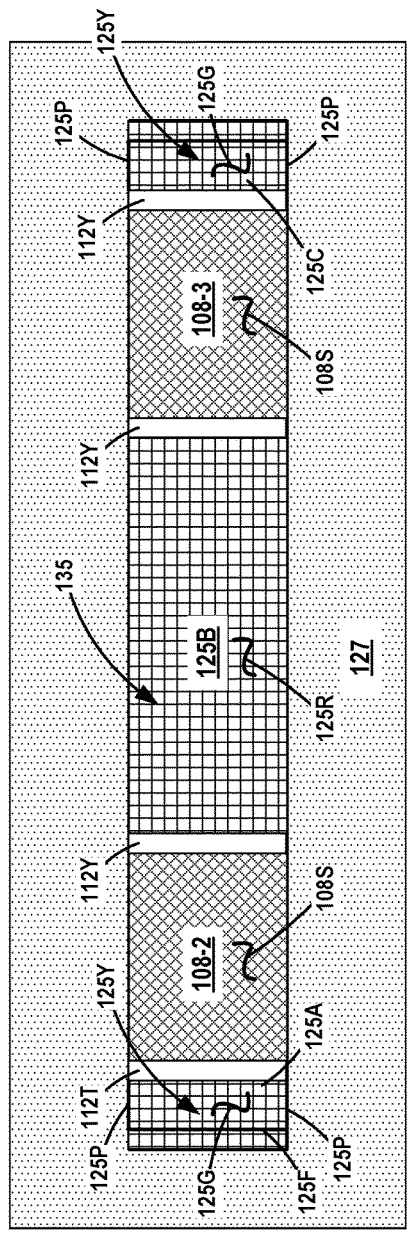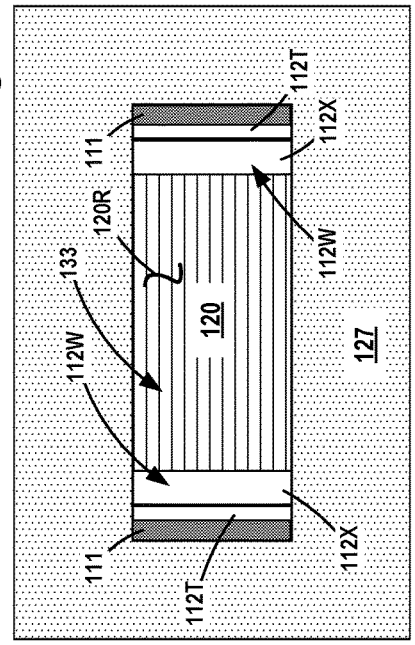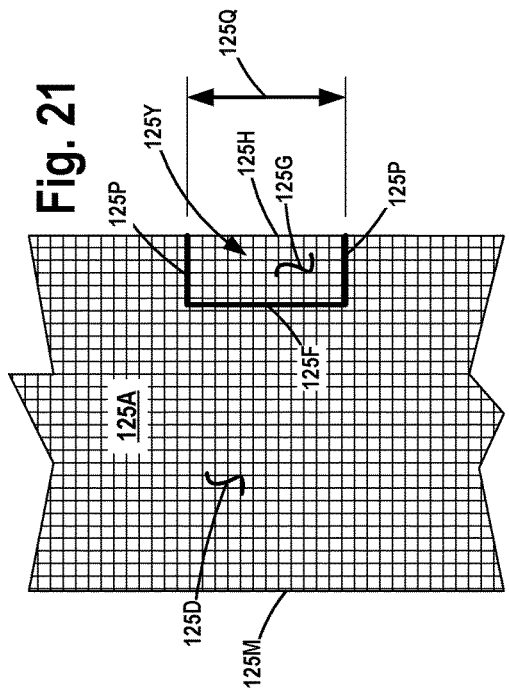

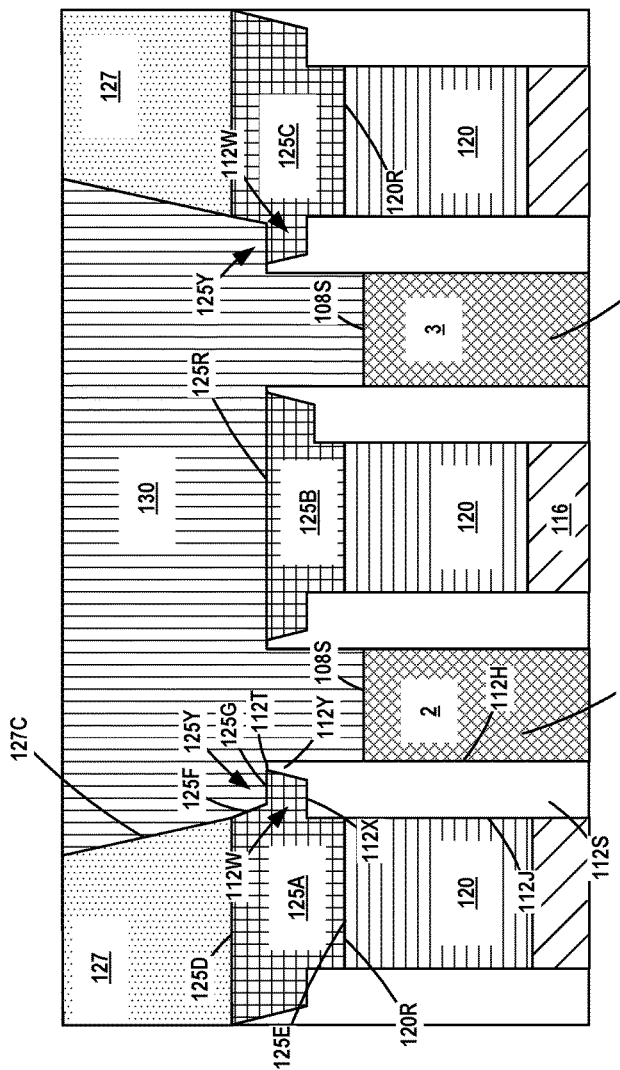
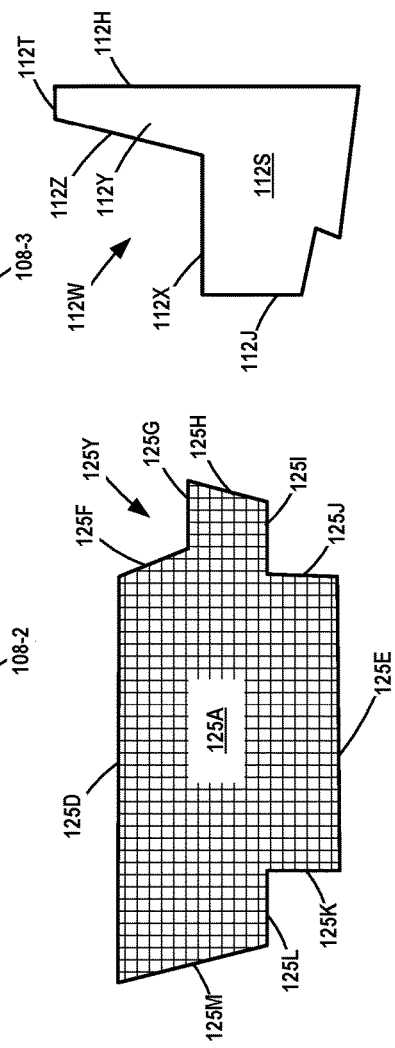
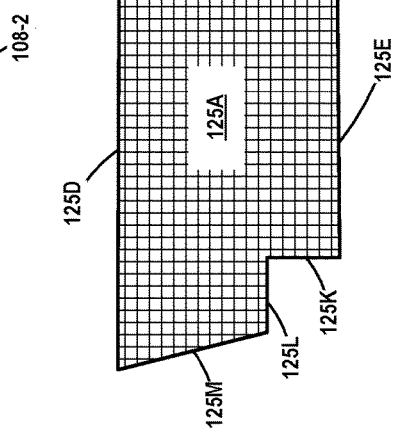
Fig. 27
Fig. 28
Fig. 29

GATE CONTACT STRUCTURE POSITIONED ABOVE AN ACTIVE REGION OF A TRANSISTOR DEVICE

BACKGROUND OF THE INVENTION

1. Field of the Invention

The present disclosure generally relates to the fabrication of integrated circuits, and, more particularly, to various embodiments of a gate contact structure that is positioned above an active region of a transistor device.

2. Description of the Related Art

In modern integrated circuits, such as microprocessors, storage devices and the like, a very large number of circuit elements, especially field effect transistors (FETs), are formed and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices, e.g., transistors, capacitors, etc., cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product. These metallization layers are typically comprised of layers of insulating material with conductive metal lines or conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures that are generally referred to as device-level contacts (explained more fully below). In some more advanced devices, another metallization layer comprised of conductive lines (sometimes called the "M0" layer) is formed between the device level contacts and the V0 vias.

There are also device level contacts positioned below the lowermost layer of the metallization system on an IC product. For example, such device level contacts include a plurality of so-called "CA contact" structures for establishing electrical connection to the source/drain regions of a transistor device, and a gate contact structure, which is sometimes referred to as a "CB contact" structure, for establishing electrical connection to the gate structure of the transistor device. The CB gate contact is typically positioned vertically above isolation material that surrounds the transistor device, i.e., the CB gate contact is typically not positioned above the active region, but it may be in some advanced architectures.

The CB gate contact is typically positioned above the isolation region so as to avoid or reduce the chances of creating an electrical short between the CB gate contact and the conductive source/drain structures (e.g., trench silicide (TS) structures) formed in the source/drain regions of the transistor adjacent the gate structure of the transistor. Insulating material, typically in the form of at least a sidewall spacer, is positioned between the gate structure and the conductive source/drain structures. Typically, there are also design rules that set a minimum spacing that must be maintained between the CB gate contact and the conductive source/drain structures in an attempt to prevent such electrical shorts. Unfortunately, there is an area penalty associated with the requirement that the CB gate contact only be positioned above the isolation region.

Efforts have been made to create process flows whereby the CB contact is formed entirely over the active area. Unfortunately, such process flows typically involve many additional process steps and may require the use of new materials. Such complex processing also inherently increases the chances of reduced product yields. What is needed is a method for forming the CB gate contact so as to conserve valuable plot space on an IC product that is less complex than the processes whereby the CB contact is formed entirely over the active region. What is further needed is a less complex process flow for forming the CB contact entirely over the active area. Some IC products include CB contacts that are formed entirely over the active region as well as other CB contacts that are formed above isolation material. What is also needed is an efficient process flow for forming all of these device level contacts on advanced IC products with densely packed transistor devices.

SUMMARY OF THE INVENTION

The following presents a simplified summary of illustrative embodiments of the invention in order to provide a basic understanding of some aspects of the illustrative embodiments of the invention specifically disclosed herein. This summary is not an exhaustive overview of the various illustrative embodiments of the inventions disclosed herein. It is not intended to identify key or critical elements of the illustrative embodiments of inventions disclosed herein or to delineate the scope of the invention. Its sole purpose is to present some concepts in a simplified form as a prelude to the more detailed description that is discussed later.

Generally, the present disclosure is directed to various embodiments of a gate contact structure that is positioned above an active region of a transistor device and various methods of making such a gate contact structure. One illustrative integrated circuit product disclosed herein includes a gate structure for a transistor, a conductive source/drain contact structure and an insulating source/drain cap structure positioned above the conductive source/drain contact structure, the insulating source/drain cap structure having a first notch formed therein. In one illustrative example, the product also includes a sidewall spacer, a portion of which is positioned laterally between the gate structure and the conductive source/drain contact structure, the sidewall spacer having a second notch formed in an upper portion of the sidewall spacer, wherein a first portion of the insulating source/drain cap structure is positioned in the second notch, and a conductive gate contact structure comprising first and second portions, the first portion of the conductive gate contact structure being positioned in the first notch, the second portion of the conductive gate contact structure being in contact with the gate structure.

BRIEF DESCRIPTION OF THE DRAWINGS

The disclosure may be understood by reference to the following description taken in conjunction with the accompanying drawings, in which like reference numerals identify like elements, and in which:

FIGS. 1-29 depict various embodiments of a gate contact structure that is positioned above an active region of a transistor device and various methods of making such a gate contact structure.

Figure 1:
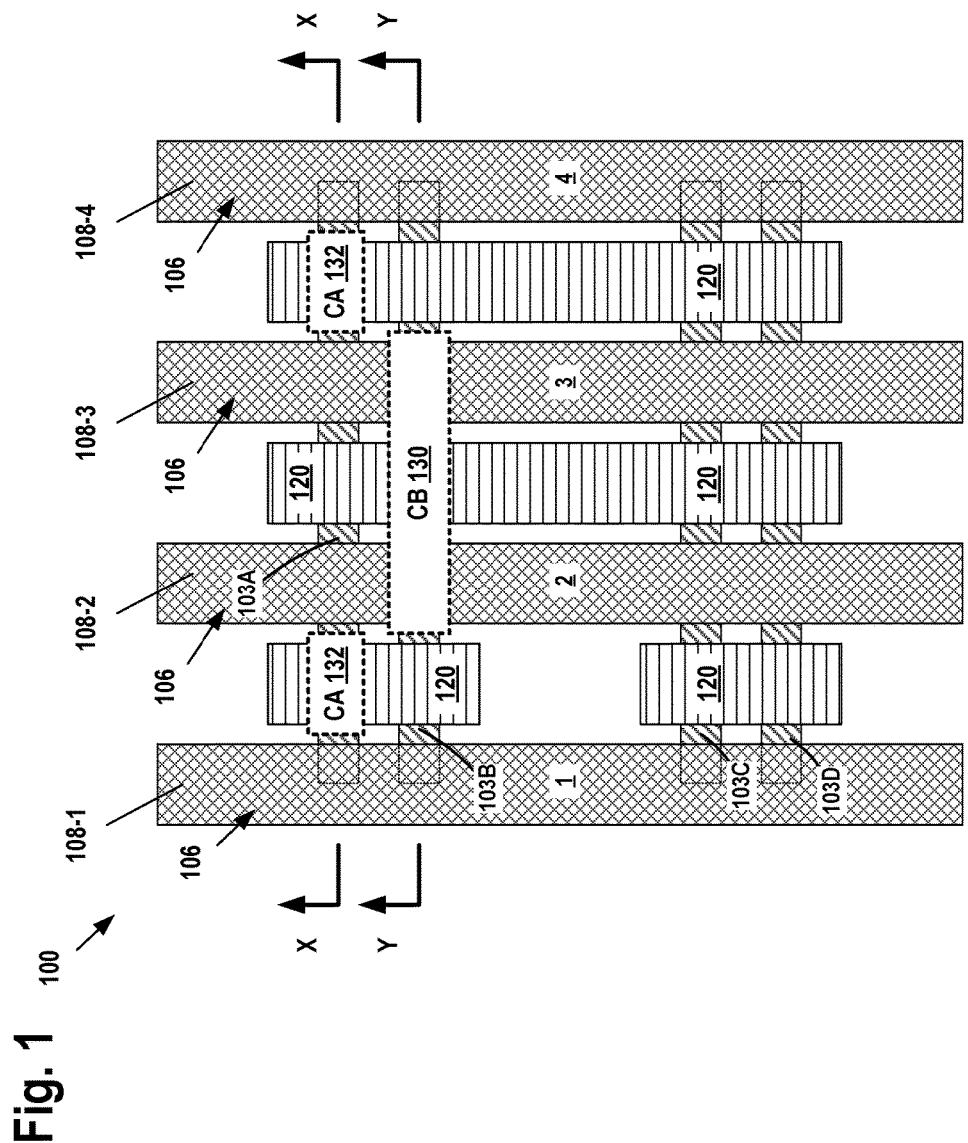

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of a gate contact structure that is positioned above an active region of a transistor device and various methods of making such a gate contact structure. The various methods disclosed herein are described in the illustrative context of forming device level contact structures, such as source/drain contact structures and gate contact structures, on IC products. However, as will be appreciated by those skilled in the art after a complete reading of the present application, the various methods and devices disclosed herein are not limited to the formation of device level contacts. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, Fin-FET devices, nanowire devices, etc. In the illustrative examples depicted herein, the transistor devices will be FinFET devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-41 depict various methods of forming contact structures, such as source/drain and gate contact structures, on an IC product 100. FIG. 1 is a simplistic plan view of one illustrative embodiment of an IC product 100 that may be formed using the methods described herein. Various cross-sectional views of the product 100 (views "X-X" and "Y-Y") are taken where indicated in FIG. 1. The cross-sectional views are taken in the gate length direction of the transistor devices.

Figure 2:
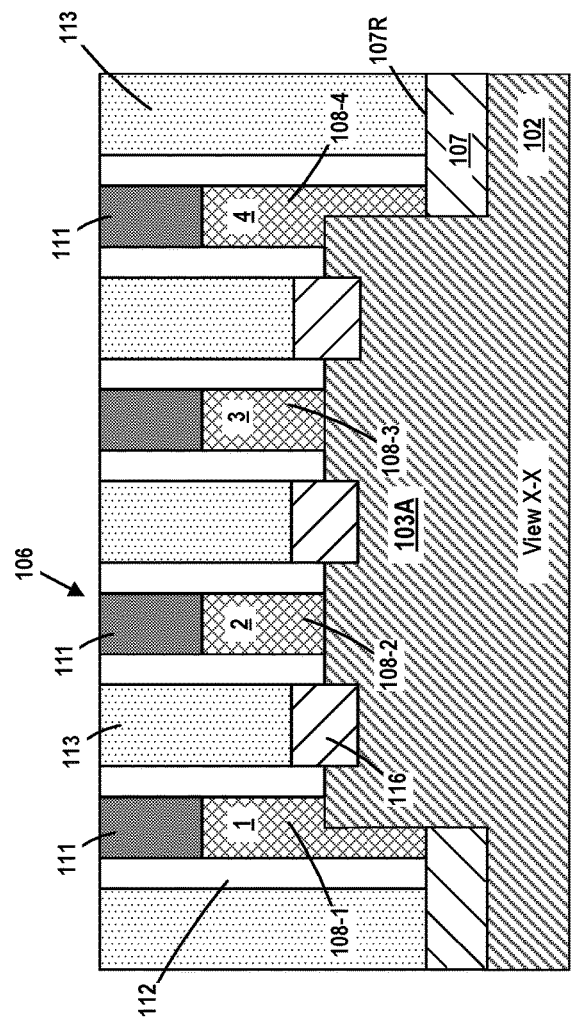
Figure 3:
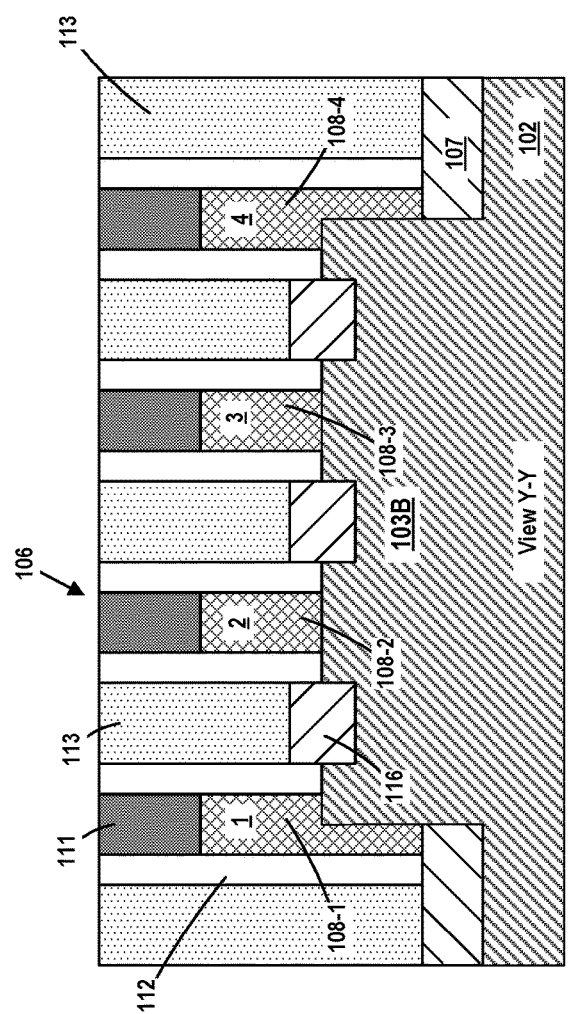

With reference to FIGS. 1-3, the product 100 generally comprises a plurality of gates 106 (see FIGS. 2-3; numbered 1-4 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices, as the methods disclosed herein may be used to form contact structures on a variety of different types of transistor devices. At the point of processing shown in FIGS. 1-3, a plurality of fins 103A-D (collectively referenced using the numeral 103) have been formed in the substrate 102 using traditional manufacturing techniques, and the gates 106 have been formed across the fins 103. Also depicted are illustrative source/drain contact structures 120 (e.g., trench silicide structures) that are conductively coupled to the source/drain regions of the transistor devices.

FIG. 1 also depicts an illustrative CB gate contact structure 130 that will be formed to contact the gate structures 108-2 and 108-3 of gates 2 and 3, respectively. Of course, as will be appreciated by those skilled in the art after a complete reading of the present application, the illustrative methods disclosed herein may be employed to form a CB gate contact structure 130 that only contacts a single gate structure 108 or more than two gate structures 108. The CB gate contact structure 130 will be positioned above the active region of the transistors. As used herein, the term "active region" should be understood to be the area or "footprint" occupied by the two conductive source/drain contact structures 120 that are positioned on opposite sides of a gate 106 as well as the portion of gate 106 itself that is positioned between the two source/drain contact structures 120. Also shown in FIG. 1 are a plurality of CA contact structures 132 that will be formed to contact the source/drain contact structures 120 of the various transistor devices.

As indicated in FIG. 1, the cross-sectional view X-X is taken through the gates 106 in a gate-length direction of the transistor devices at a location where a plurality of CA contact structures 132 will be formed. In the case where the transistor devices are FinFET devices, the view X-X should be understood to be a cross-sectional view taken through the long axis of the fin 103A in a direction that corresponds to the gate length (current transport) direction of a FinFET device. The cross-sectional view Y-Y is taken through the gates 106 in a gate-length direction of the transistor devices at a location where the CB gate contact structure 130 will be formed. In the case where the transistor devices are FinFET devices, the view Y-Y should be understood to be a cross-sectional view taken through the long axis of the fin 103B in a direction that corresponds to the gate length (current transport) direction of a FinFET device.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIGS. 2 and 3 depict the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define a plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques.

Still with reference to FIGS. 2 and 3, after the layer of insulating material 107 was recessed, the gates 106 were formed above the fins 103. Each of the gates 106 includes a schematically depicted final gate structure 108 (numbered 108-1 to 108-4 for reference purposes), a gate cap 111 and a simplistically-depicted sidewall spacer 112. The lateral thickness (at its base) of the simplistically-depicted sidewall spacer 112 may vary depending upon the particular application. Typically, when the gate structures 108 are manufactured using known replacement gate manufacturing techniques, the materials for the gate structures 108 are sequentially formed in gate cavities between the spacers 112 after removal of a sacrificial gate electrode (not shown) and a sacrificial gate insulation layer (not shown). The gate structures 108 are typically comprised of a high-k gate insulation layer (not shown), such as hafnium oxide, a material having a dielectric constant greater than 10, etc., and one or more conductive material layers that function as the gate electrode of the gate structure 108. For example, one or more work-function adjusting metal layers and a bulk conductive material may be deposited to form the gate electrode structure.

Still referencing FIGS. 2 and 3, prior to the formation of the final gate structures 108, epi semiconductor material 116 was formed on the exposed portions of the active regions (or fins 103 in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings. Also depicted are illustrative source/drain contact structures 120 which typically include a so-called "trench silicide" (TS) structure (not separately shown).

After formation of the epi semiconductor material 116, a layer of insulating material 113 (e.g., silicon dioxide) was blanket-deposited across the substrate. Thereafter a CMP process was performed to planarize the layer of insulating material 113 using the original gate caps (not shown) positioned above the sacrificial gate structures as a polish-stop layer. At that point, traditional replacement gate manufacturing processes were performed to remove the original gate caps and the sacrificial gate structures and to form the final gate structures 108 within the gate cavities defined by removing the sacrificial gate structures. Thereafter, in this particular embodiment, the materials of the final gate structures were recessed and the final gate caps 111 were formed on the product 100 by depositing gate cap material and performing a CMP process operation to planarize the upper surface of the gate caps 111 with the upper surface of the layer of insulating material 113.

Figure 4:
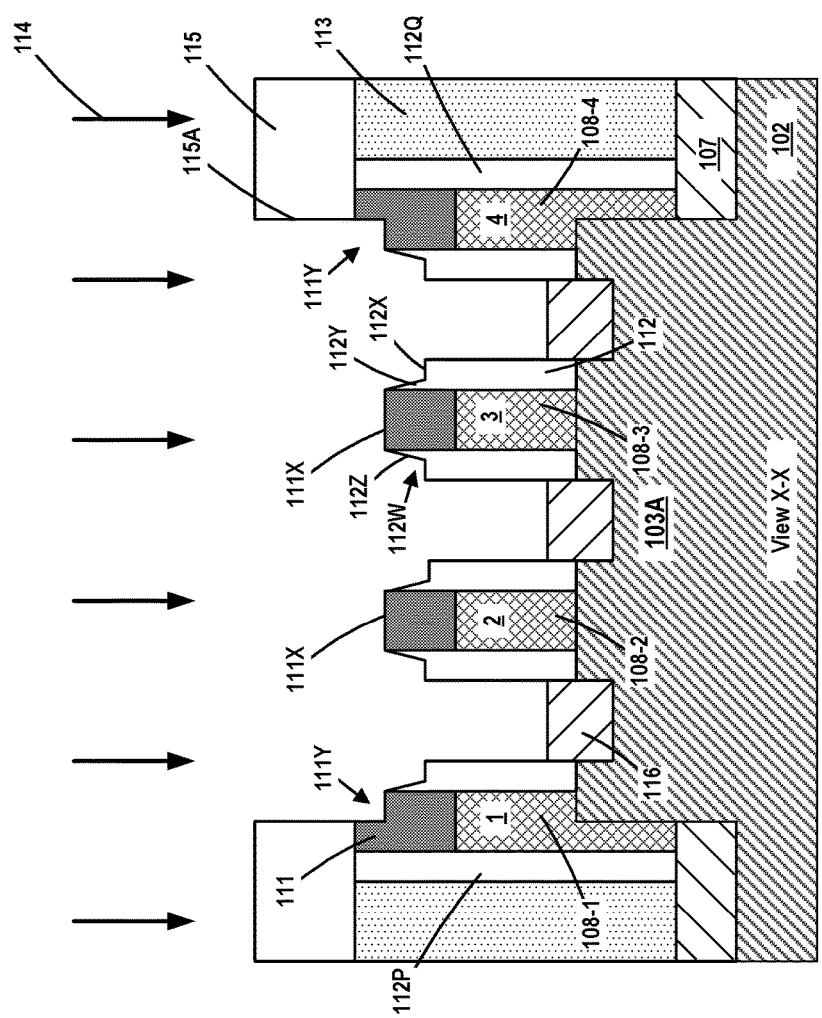
Figure 5:
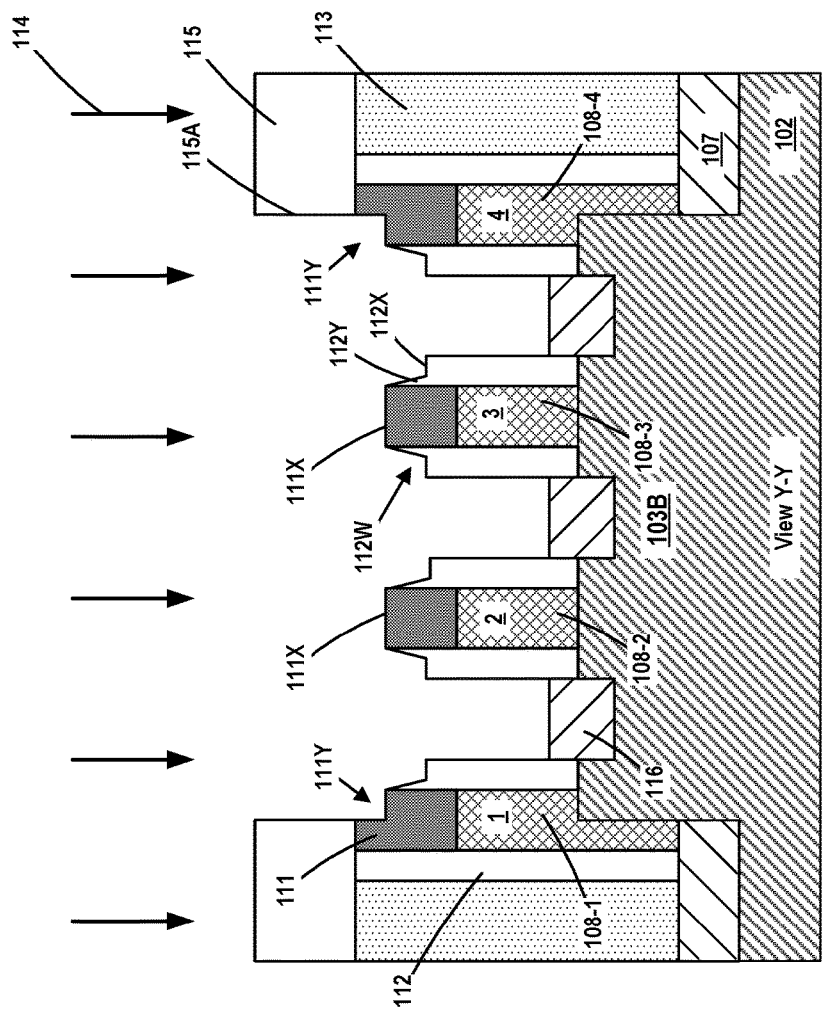

FIGS. 4 and 5 depict the IC product 100 after several process operations were performed. First, a patterned etch mask 115, e.g., a patterned OPL layer, was formed on the product 100. The patterned etch mask 115 comprises an opening 115A. The patterned etch mask 115 is representative in nature in that it may be comprised of one or more layers of materials. Then, an etching process 114 was performed on the product 100. The etching process 114 is designed to remove the portions of the layer of insulating material 113 positioned above the epi semiconductor material 116 in the source/drain regions of the transistor devices and thereby expose the source/drain regions, i.e., to expose the epi semiconductor material 116 positioned between the spacers 112. However, portions of the gate caps 111, the spacers 112 and the layer of insulating material 113 are all subjected to this common etching process 114.

The materials of construction for the gate caps 111, the spacers 112 and the layer of insulating material 113 may be specifically selected so as to achieve the objectives set forth below. Of course, the materials of construction for the gate caps 111, the spacers 112 and the layer of insulating material 113 may vary depending upon the particular application. In terms of relative etch selectivity during this common etching process 114, the material of the gate caps 111 will exhibit the slowest etch rate among the three materials, while the material of the layer of insulating material 113 will exhibit the fastest etch rate among the three materials. The material of the sidewall spacers 112 will exhibit an etch rate that is intermediate the etch rate of the gate caps 111 and the etch rate of the layer of insulating material 113 when subjected to this common etching process 114. In one example, the material of the spacers 112 exhibits an etch rate that is closer to the etch rate of the layer of insulating material 113 than it is to the etch rate of the material for the gate caps 111 when subjected to this common etching process 114. In one illustrative embodiment, the layer of insulating material 113 may be comprised of silicon dioxide, the sidewall spacers 112 may be comprised of silicon carbon oxynitride (SiCON) or silicon carbon oxide (SiCO), and the gate caps 111 may be comprised of silicon nitride. As a result, at the completion of the common etching process 114, the layer of insulating material 113 is essentially cleared from above the epi semiconductor material 116 in the source/drain regions of the transistor devices, a portion of the upper part of the spacers 112 was removed and a portion of the thickness of the gate caps 111 was removed.

More specifically, due to the selection of the appropriate materials, a notch 111Y is formed in the gate caps 111 positioned on the gates 1 and 4, i.e., in the gate caps 111 on the outermost gates (1 and 4) of the array of gates 1-4, while the gate caps 111 on gates 2 and 3 have a substantially planar upper surface 111X. Additionally, during this common etching process 114, the spacers 112 are etched in such a manner so as to form a notch 112W in the spacers 112. The notch 112W is not formed in the outermost spacers 112P and 112Q since these spacers are covered by the patterned etch mask 115. The notch 112W in each of the etched spacers 112 extends axially into and out of the plane of the drawing page for a distance that corresponds approximately to the axial length (in the gate width direction of the transistor devices) of the conductive source/drain contact structure 120 positioned adjacent each of the particular spacers 112. In the depicted example, the notch 112W is defined by a tapered surface 112Z and a substantially horizontally oriented surface 112X. At this point in the process flow, the etched portion of the spacers 112 (other than the two outermost spacers 112P and 112Q) comprises an upwardly extending tapered portion 112Y.

Figure 6:
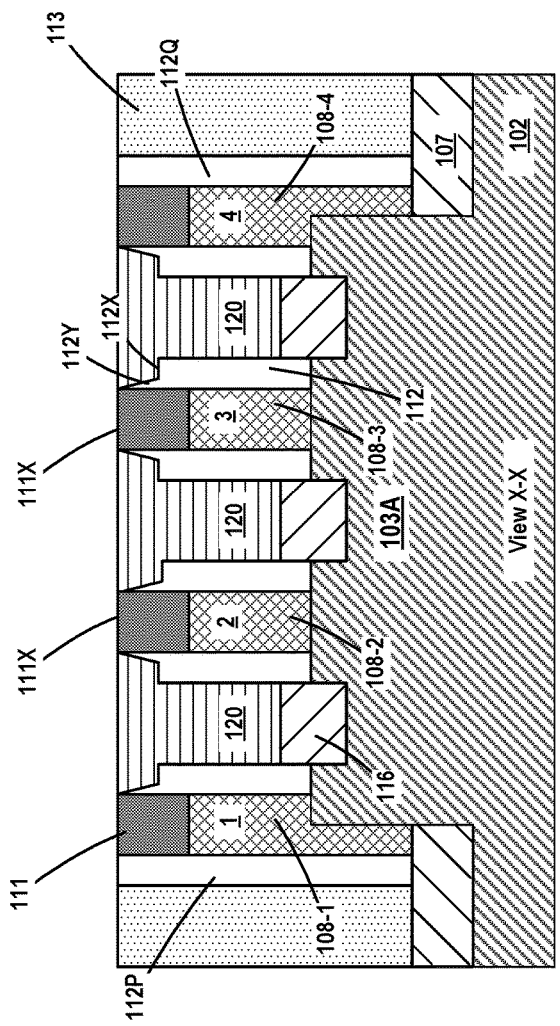
Figure 7:
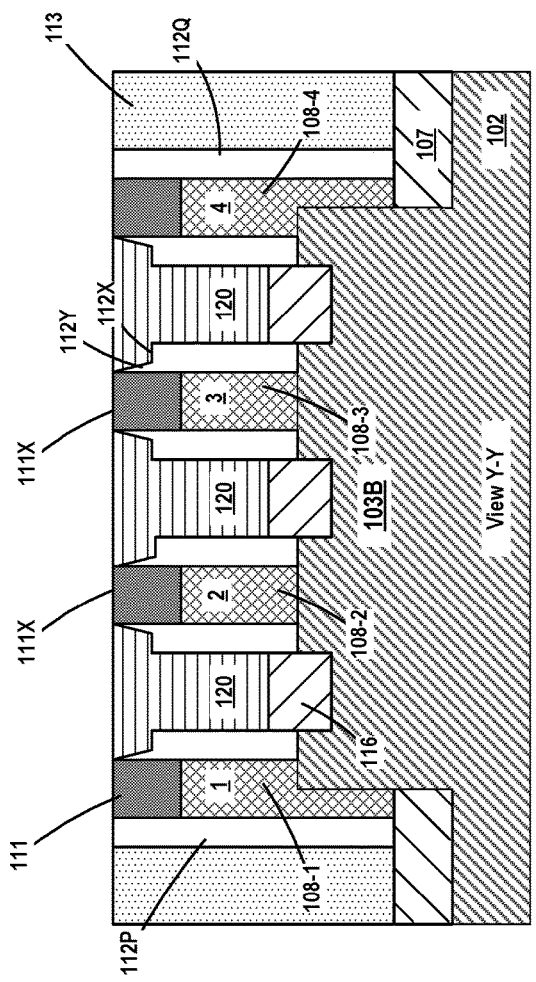

FIGS. 6 and 7 depict the IC product 100 after several process operations were performed. First, the patterned etch mask 115 was removed. Then, material for the illustrative source/drain contact structures 120 (e.g., trench silicide structures) was formed above the product 100 so as to over-fill the spaces above the exposed epi semiconductor material 116 in the source/drain regions of the devices. At that point, one or more CMP process operations were performed to planarize the upper surface of the product with a level that approximately corresponds to the recessed upper surface 111X of the gate caps 111. These process operations result in the removal of portions of the layer of insulating material 113 and portions of the outermost spacers 112P, 112Q positioned adjacent the outside sidewall of the gate structures 108-1 and 108-4.

Figure 8:
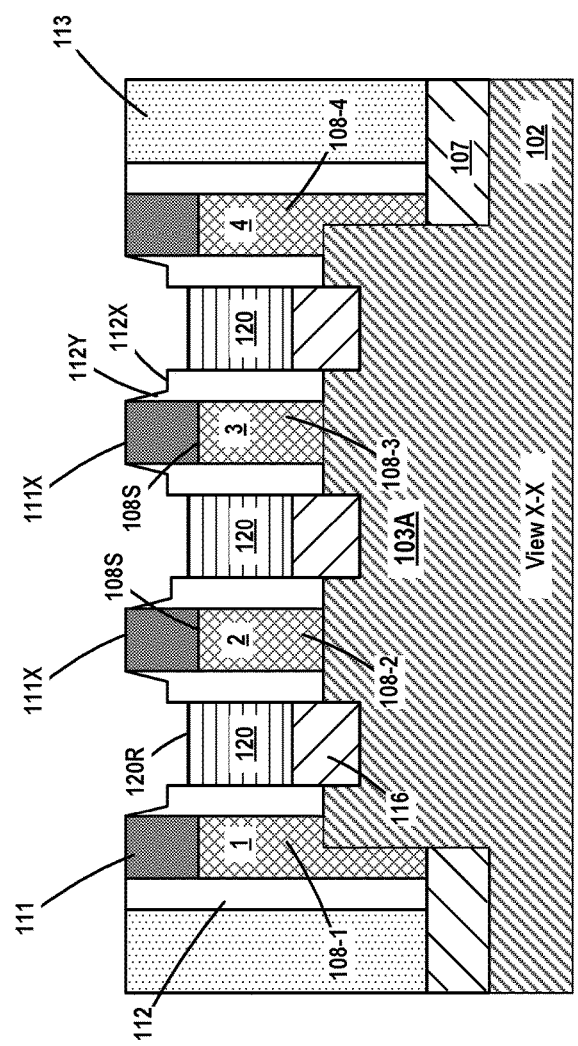
Figure 9:
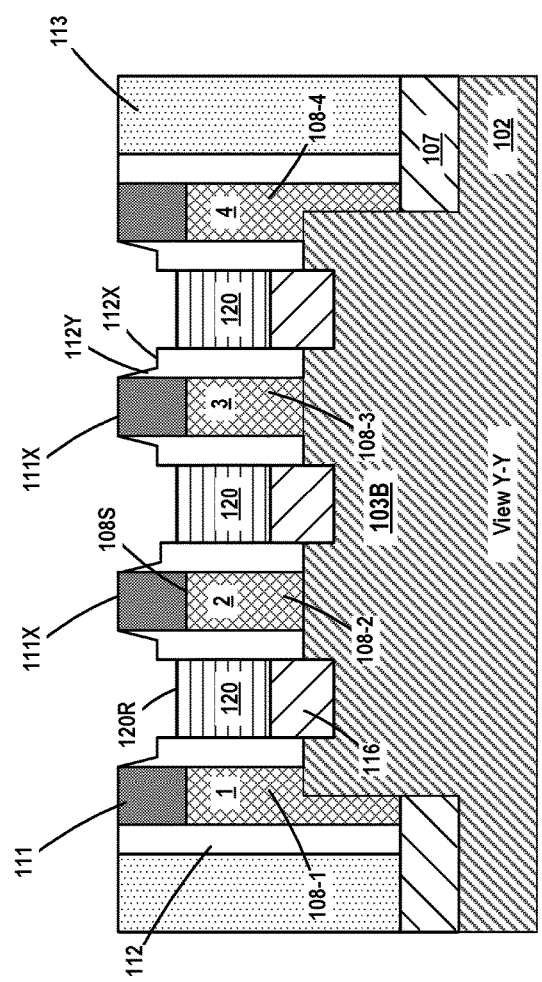

FIGS. 8 and 9 depict the IC product 100 after one or more recess etching processes were performed to recess the conductive source/drain contact structures 120. As shown in FIG. 1, the conductive source/drain contact structures 120 may extend at least for substantially the entire dimension of the active region in the gate width direction of the transistor devices (into and out of the plane of the drawing page in FIGS. 8 and 9) and in some cases may extend across the source/drain regions of multiple transistor devices. At the conclusion of these process operations, the source/drain contact structures 120 have a recessed upper surface 120R. The recessing of these conductive structures is performed so as to provide an increased vertical spacing between the recessed upper surface 120R of the conductive source/drain contact structures 120 and the CB gate contact structure 130 that will eventually be formed on the product 100. The amount of recessing of the source/drain contact structures 120 may vary depending upon the particular application (e.g., 5-30 nm). At the conclusion of this recess etching process, the recessed upper surface 120R may be positioned at a level that is above (e.g., 5-20 nm) the upper surface 108S of the gate structures 108.

Figure 10:
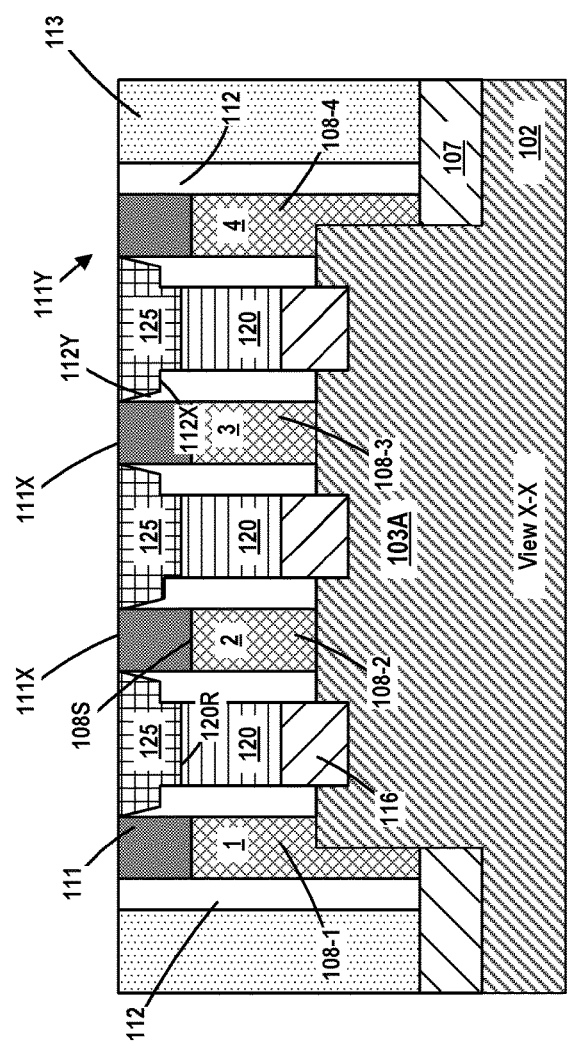
Figure 11:
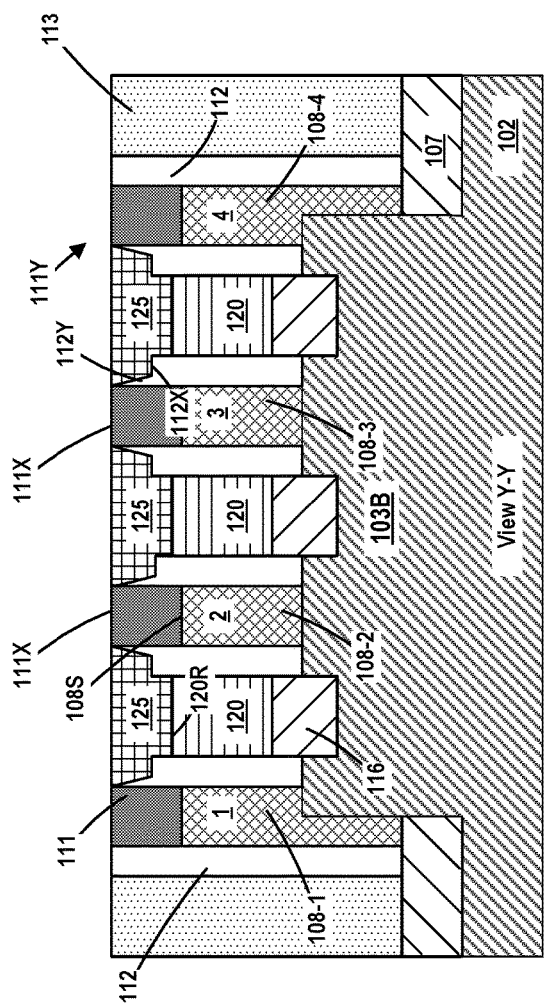

FIGS. 10 and 11 depict the product 100 after insulating source/drain cap structures 125 were formed in the cavities above the recessed conductive source/drain contact structures 120. The insulating source/drain cap structures 125 may be comprised of a variety of different materials, e.g., silicon carbon, silicon dioxide, silicon carbon oxide (SiCO), etc. The insulating source/drain cap structures 125 may be formed by depositing material for the insulating source/drain cap structures 125 across the substrate so as to over-fill the cavities above the recessed conductive source/drain contact structures 120, and thereafter performing a CMP or etch-back process to remove excess amounts of the material for the insulating source/drain cap structures 125.

Figure 12:
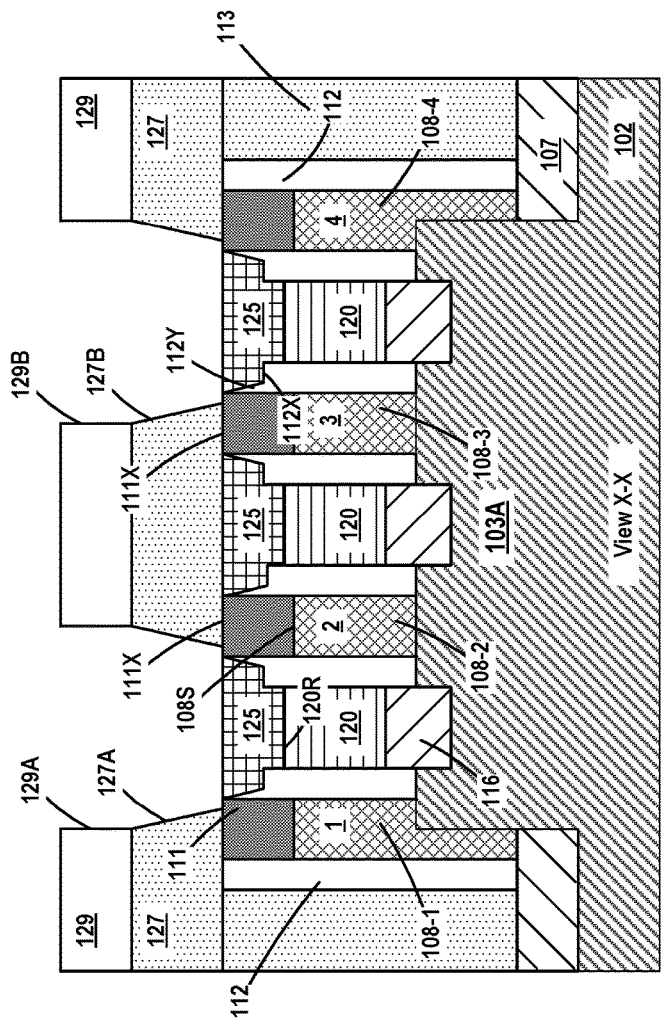
Figure 13:
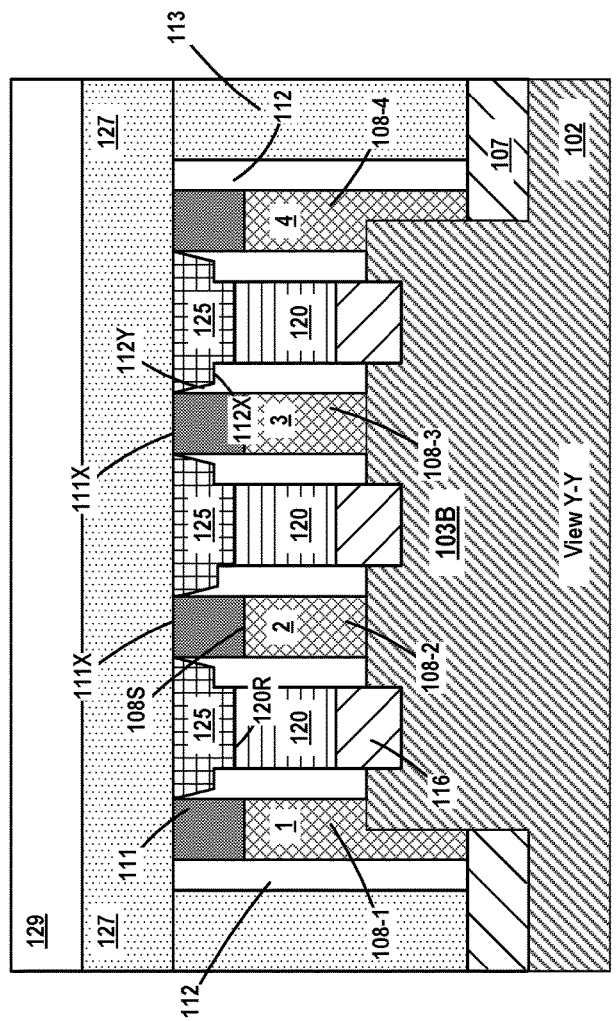

FIGS. 12 and 13 depict the product 100 after several process operations were performed. First, additional insulating material 127, e.g., silicon dioxide, was formed above the product 100. Thereafter, a patterned etch mask 129 e.g., a patterned OPL layer, was formed above the insulating material 127. The patterned etch mask 129 comprises a plurality of openings 129A, 129B (see FIG. 12) that corresponds to locations where the CA contact structures 132 will be formed. The patterned etch mask 129 is representative in nature in that it may be comprised of one or more layers of materials. Then, an etching process was performed through the patterned etch mask 129 to form the openings 127A, 127B in the insulating material 127. At the conclusion of this etching process, portions of the insulating source/drain cap structures 125 are exposed at locations where the CA contact structures 132 will be formed to conductively contact the recessed conductive source/drain contact structures 120. In the example depicted herein, the CA contact structures 132 are arranged in a staggered pattern and thus only two openings 127A, 127B are shown in the view depicted in FIG. 12. Another contact opening (not shown) will be formed in the insulating material 127 for another CA contact structure (not shown) to contact the conductive source/drain contact structure 120 positioned between gates 2 and 3, but that contact opening is not located in the plane of the cross-section depicted in FIG. 12. At this point in the process flow, the patterned etch mask 129 covers the location where the CB gate contact structure 130 will be formed (see FIG.

13). The insulating material 127 may be made of the same material as that of the insulating material 113 or it may be a different insulating material.

Figure 14:
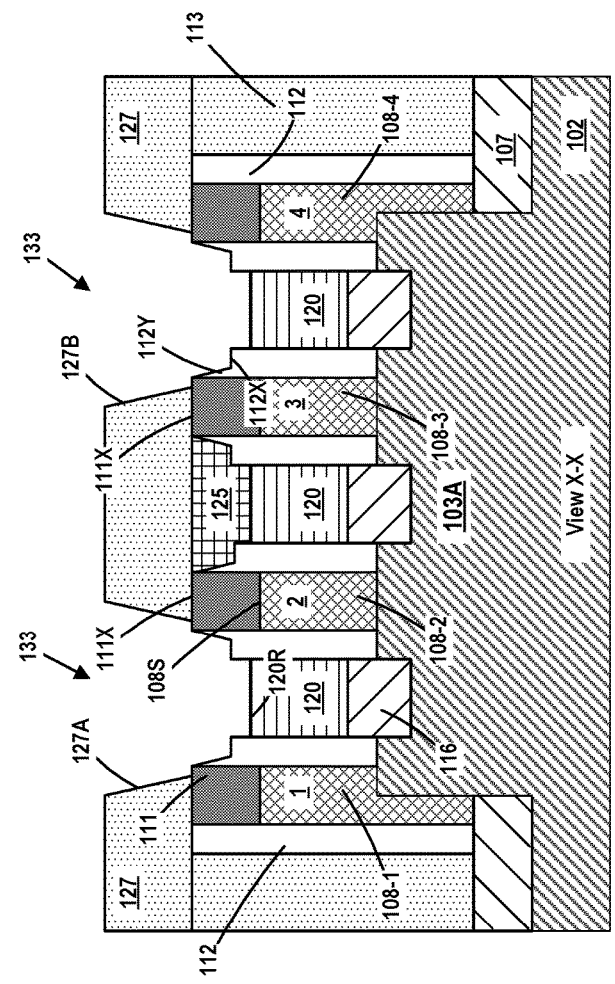
Figure 15:
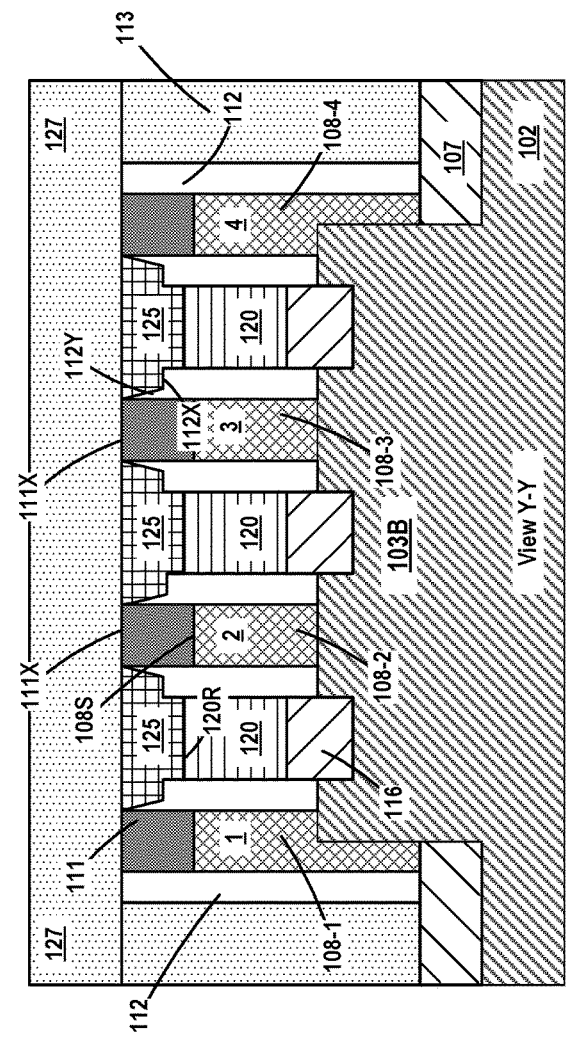

FIGS. 14 and 15 depict the product 100 after several process operations were performed. First, one or more etching processes were performed through the openings 129A, 129B in the patterned etch mask 129 to remove the exposed portions of the insulating source/drain cap structures 125 so as to form a plurality of CA contact openings 133 for the CA contact structures 132. At the conclusion of this etching process, portions of the recessed conductive source/drain contact structures 120 are exposed by the formation of the CA contact openings 133. Thereafter, the patterned etch mask 129 was removed.

Figure 16:
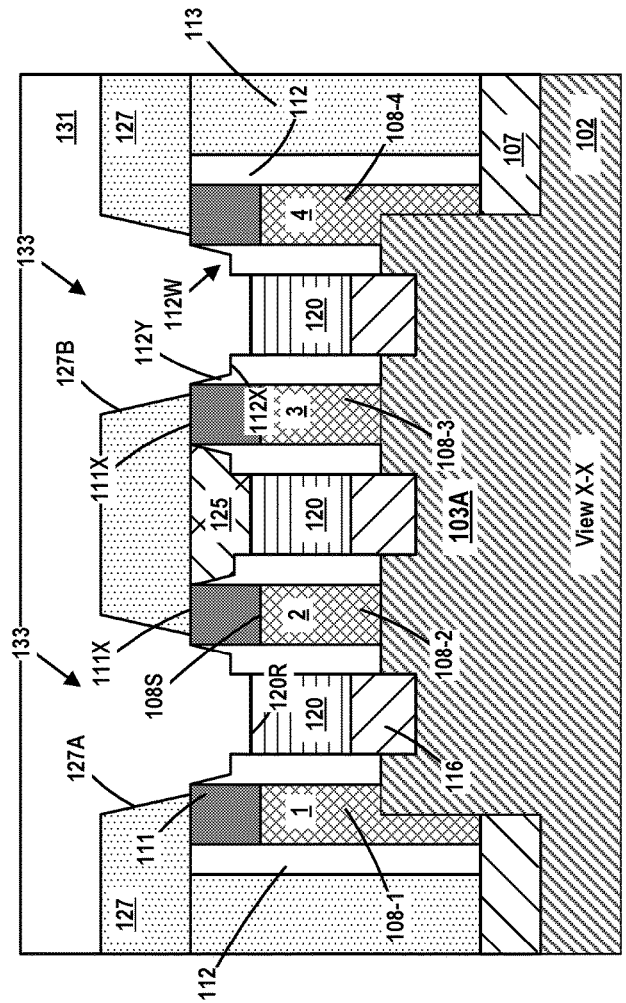
Figure 17:
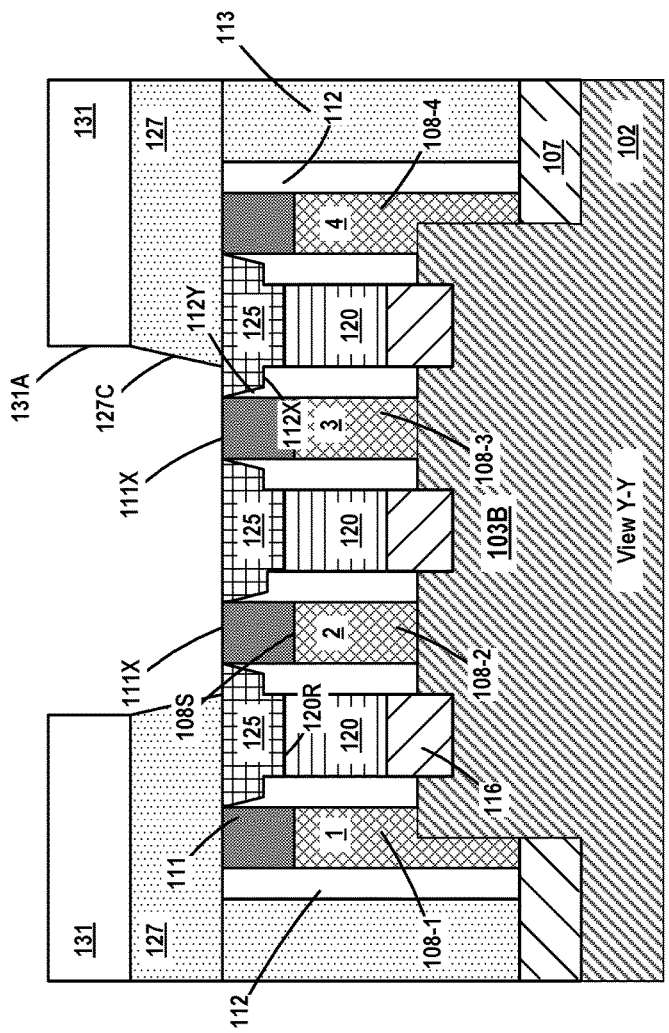

FIGS. 16 and 17 depict the product 100 after several process operations were performed. First, another patterned etch mask 131 e.g., a patterned OPL layer, was formed above the insulating material 127. The patterned etch mask 131 comprises an opening 131A (see FIG. 17) that corresponds to the location where the CB gate contact structure 130 will be formed. As shown in FIG. 16, the patterned etch mask 131 covers the CA contact openings 133 where the CA contact structures 132 will be formed. The patterned etch mask 131 is representative in nature in that it may be comprised of one or more layers of materials. Then, an etching process was performed through the opening 131A in the patterned etch mask 131 to form an opening 127C in the insulating material 127. At the conclusion of this etching process, portions of the gate caps 111 above gates 2 and 3 as well as portions of the adjacent insulating source/drain cap structures 125 are exposed. Note that, as mentioned above, in the illustrative example depicted herein, the illustrative CB gate contact structure 130 that will be depicted herein is formed to contact both of the gate structures 108-2 and 108-3.

Figure 18:
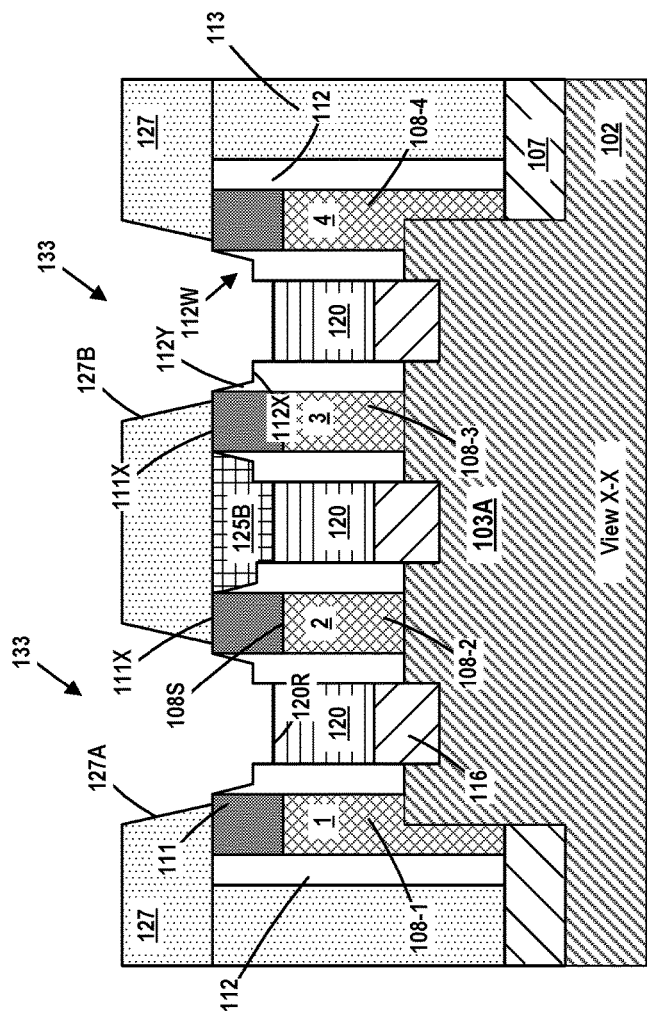
Figure 19:
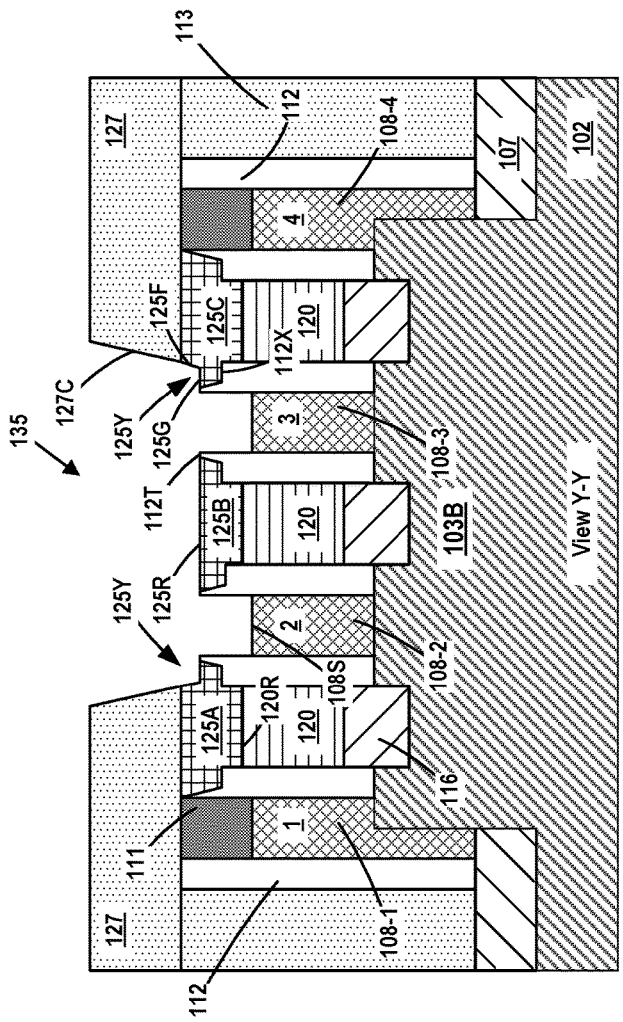

FIGS. 18 and 19 depict the product 100 after several process operations were performed. Reference numerals 125A, 125B and 125C have been added to the insulating source/drain cap structures 125 in FIGS. 18 and 19. First, with reference to FIGS. 17 and 19, one or more etching processes were performed through the opening 131A in the patterned etch mask 131 to remove the exposed portions of the gate caps 111 positioned above gates 2 and 3 so as to form a gate contact opening 135. At the conclusion of the etching process, portions of the upper surface 108S of the gate structures 108-2 and 108-3 are exposed by the formation of the gate contact opening 135. Thereafter, the patterned etch mask 131 was removed. Note that, during this etching process, the insulating source/drain cap structures 125 exposed by the opening 127C protect the recessed conductive source/drain contact structures 120 that are exposed to this etching process. Also note that, at the conclusion of this etching process, a notch 125Y has been formed in the portion of the outermost insulating source/drain cap structures 125A, 125C. In one illustrative embodiment, the notch 125Y comprises a substantially horizontally oriented surface 125G and a substantially tapered surface 125F.

FIG. 20 is an enlarged plan view of the gate contact opening 135. FIG. 21 is an enlarged plan view of a portion of the axial length of the source/drain cap structure 125A. FIG. 20 depicts the exposed upper surfaces 108S of the gate structures 108 for gates 2 and 3, the upper surface 112T of the tapered portion 112Y of the various spacers 112, portions of the outermost source/drain cap structures 125A and 125C and the upper surface 125R of the source/drain cap structure 125B. FIGS. 20 and 21 also show the formation of the notches 125Y in the outermost source/drain cap structures 125A and 125C. More specifically, and with additional reference to FIG. 28 (a cross-sectional view of the source/drain cap structure 125A), the source/drain cap structures 125A and 125C comprise an upper surface 125D and tapered side surfaces 125M and 125H. The notches 125Y have an outwardly tapered surface 125F, a substantially horizontally oriented bottom surface 125G and side surfaces 125P. As best seen in FIG. 21, the notches 125Y have an axial length 125Q (in the gate width direction of the transistor devices) that corresponds approximately to the width (in the gate width direction of the transistor devices) of the bottom portion of the CB gate contact structure 130 that will be formed in the notches 125Y. FIG. 22 depicts one of the CA contact openings 133. FIG. 22 shows the formation of the notches 112W in the spacers 112, the upper surface 112T of the tapered portion 112Y of the spacers 112, the portions of the gate caps 111 and the substantially horizontally oriented surface 112X of the notch 112W. FIG. 22 also depicts the exposed portion of an upper surface 120R of the recessed conductive source/drain contact structure 120.

Figure 23:
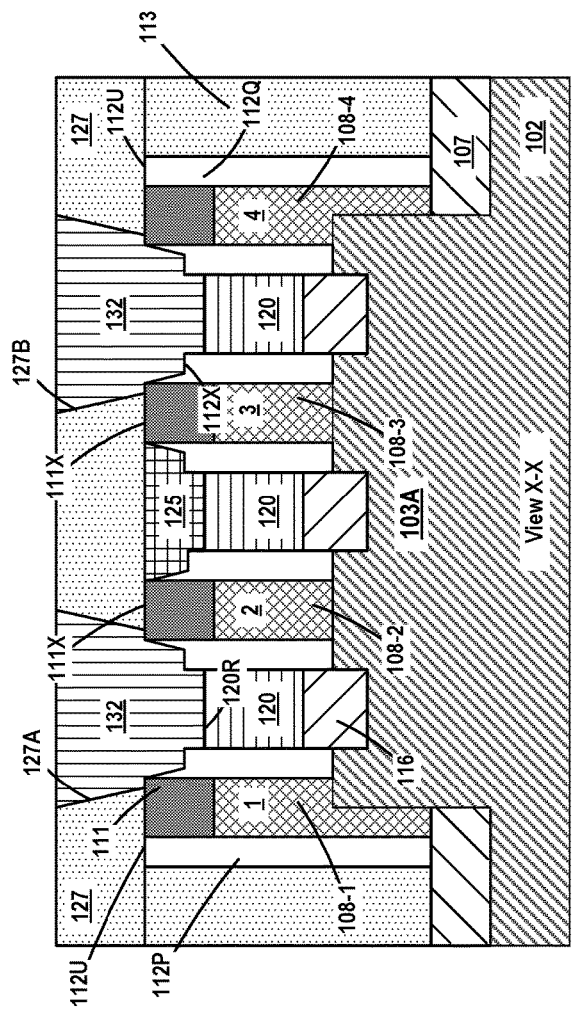
Figure 24:
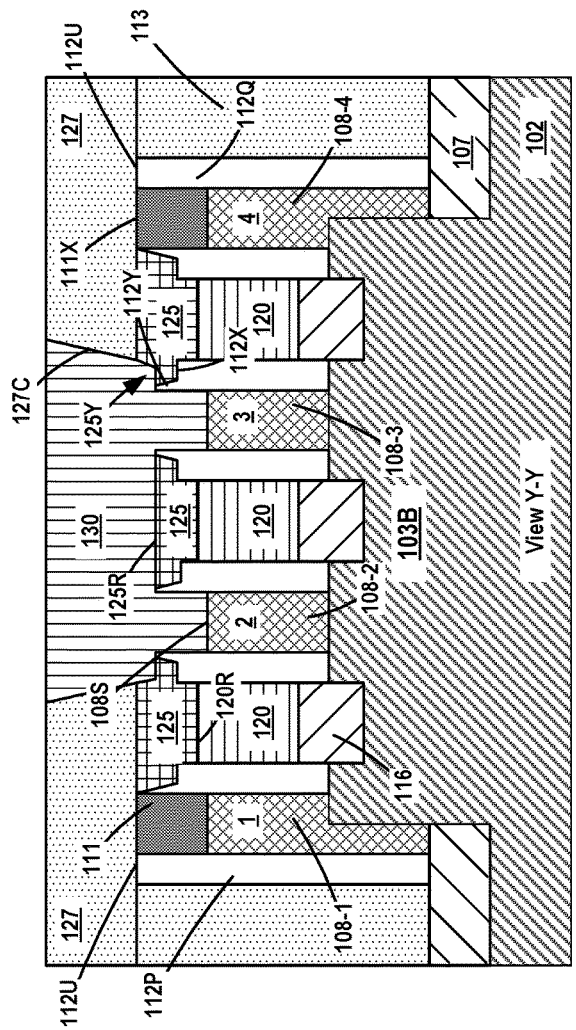
Figure 25:
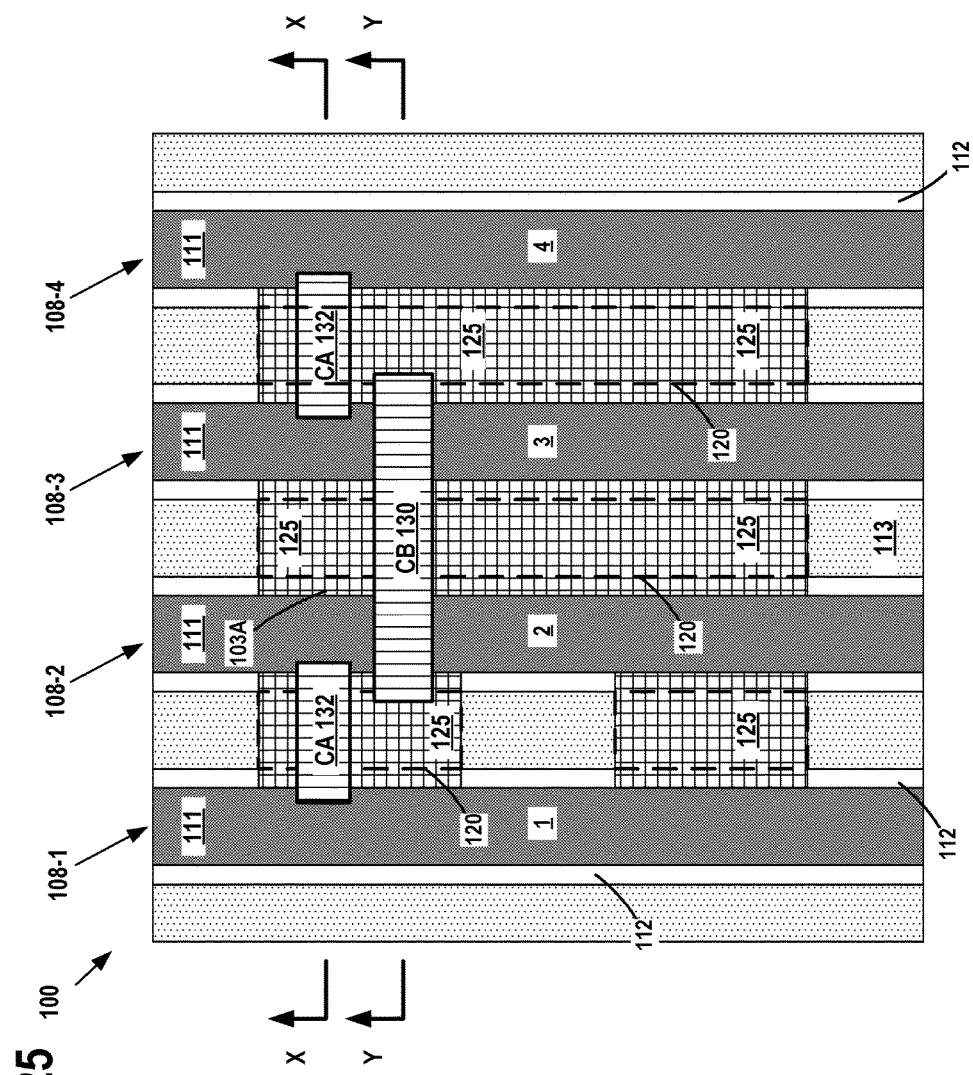

FIG. 23 (cross-sectional view), FIG. 24 (cross-sectional view) and FIG. 25 (simplistic plan view) depict the product 100 after several process operations were performed to form the CB gate contact structure 130 and the CA contact structures 132 for the transistor devices. The layer of insulating material 127 has been omitted from FIG. 25 for clarity. The recessed conductive source/drain contact structures 120 are depicted in dashed lines in FIG. 25 as they are positioned under the insulating source/drain cap structures 125. Also depicted in FIG. 25 are the gate caps 111 for the gate structures 108 and the sidewall spacers 112. With reference to FIGS. 23 and 24, note that the upper surface 112U of the outermost spacers 112P, 112Q in the collective array of transistors is substantially level with the upper surfaces 111X of the gate caps 111.

The CB gate contact structure 130 and the CA contact structures 132 may be comprised of a variety of different materials and they may be formed by performing various manufacturing techniques. In one illustrative example, one or more conformal barrier layers and/or seed layers (not separately shown) were formed so as to line the gate contact opening 135 and the CA contact openings 133 with the barrier material(s). Next, one or more conductive materials (e.g., copper, a metal-containing material, a metal compound, etc.) was then formed on the product 100 so as to overfill the gate contact opening 135 and the CA contact openings 133. At that point, a CMP process was performed to remove excess portions of the conductive materials from above the upper surface of the layer of insulating material 127. These process operations result in the formation of a CB gate contact structure 130 and two CA contact structures 132. The CB gate contact structure 130 is positioned above the active region and it conductively contacts the gate structure 108-2 of gate 2 and the gate structure 108-3 of gate 3. Each of the CA contact structures 132 conductively contacts an underlying source/drain contact structure 120. Note that, in the illustrative process flow above, the CA contact openings 133 were formed before the gate contact opening 135 was formed, but the order of formation of the gate contact opening 135 and the CA contact openings 133 may be reversed if desired.

Figure 26:
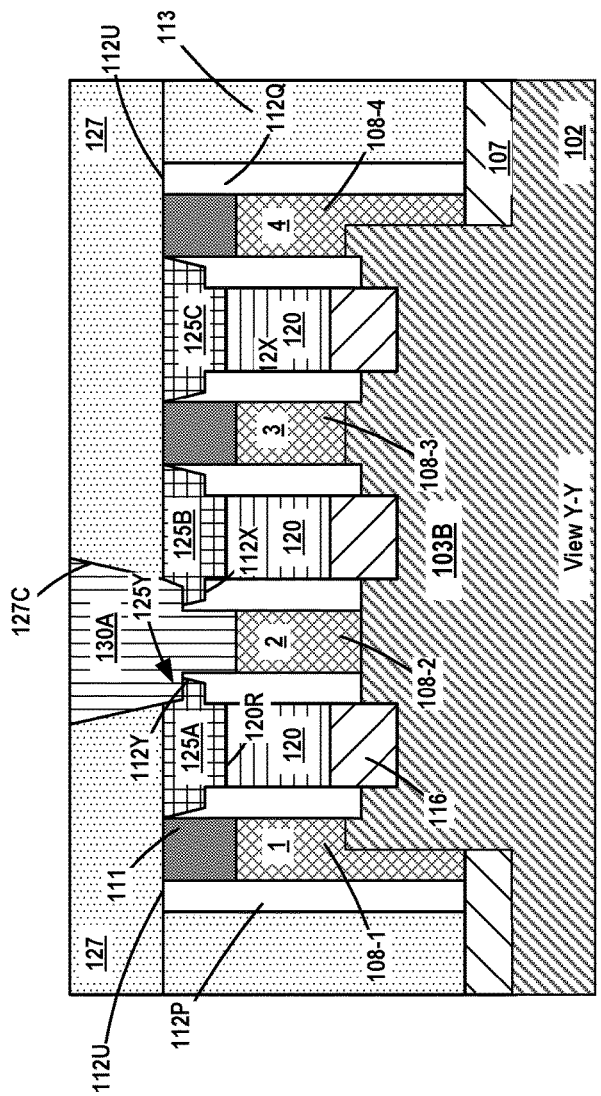

FIG. 26 depicts an embodiment wherein the methods disclosed herein were performed to form a CB gate contact structure 130A that is this conductively coupled to only a single gate structure—the gate structure 108-2 of gate 2.

FIG. 27 is an enlarged view of the illustrative gate contact structure 130 shown in FIG. 24 and the surrounding materials. Reference numerals 125A, 125B and 125C have been added to the insulating source/drain cap structures 125. FIG. 28 is an enlarged view of the insulating source/drain cap structure 125A. The insulating source/drain cap structure 125C is a substantial mirror image of the insulating source/drain cap structures 125A. The insulating source/drain cap structures 125A and 125B positioned laterally adjacent the CB gate contact structure 130A shown in FIG. 26 have substantially the same configuration as the insulating source/drain cap structure 125A (and 125C). FIG. 29 is an enlarged view of the upper portion of the spacer 112 positioned to the left of the gate structure 108-2 of gate 2, that is now identified with the reference numeral 112S.

As will be appreciated by those skilled in the art after a complete reading of the present application, the insulating source/drain cap structures 125A and 125C positioned adjacent the outer edges of the CB gate contact structure 130 (or 130A) have a very unique cross-sectional configuration (when viewed in a cross-section taken through the insulating source/drain cap structures 125 in the gate length direction of the transistor devices). Similarly, the spacers 112 positioned adjacent the insulating source/drain cap structures 125A and 125C, such as the spacer 112S, also have a very unique configuration.

With reference to FIG. 27, the insulating source/drain cap structure 125A (and 125C) is a multi-sided polygon structure comprised of a plurality of surfaces. More specifically, with reference to FIG. 28, and as noted above, these structures comprise an upper surface 125D and a lower surface 125E. The lower surface 125E is adapted to engage the recessed upper surface 120R of an underlying conductive source/drain contact structure 120. As noted above, the insulating source/drain cap structure 125A (and 125C) also has a notch 125Y that extends axially into and out of the plane of the drawing page of FIG. 28 for a distance that corresponds approximately to the axial length (in the gate width direction of the transistor devices) of the lower portion of the CB gate contact structure 130 that is positioned in the notch 125Y. As noted above, the notch 125Y is defined by an outwardly tapered surface 125F (relative to the location of the CB gate contact structure 130), a substantially horizontally oriented bottom surface 125G and the side surfaces 125P (see FIG. 21). In one illustrative example, a portion of the CB gate contact structure 130 is positioned within the notch 125Y and physically engages or contacts the surfaces 125F, 125G and 125P. The illustrative insulating source/drain cap structure 125A (and 125C) comprises additional tapered surfaces 125H and 125M, substantially vertically oriented side surfaces 125J, 125K and substantially horizontally oriented surfaces 125I, 125L. The portion of the insulating source/drain cap structure 125A (and 125C) positioned below the level defined by the substantially horizontally oriented surfaces 125I, 125L is positioned within a cavity above an underlying recessed conductive source/drain contact structure 120.

FIG. 29 is an enlarged view of the upper portion of the spacer 112S. The lower surface 125E of the insulating source/drain cap structure 125A (and 125C) is adapted to engage the recessed upper surface 120R of an underlying conductive source/drain contact structure 120. The spacers 112 (other than the two outermost spacers 112P and 112Q (see FIG. 23) also have a notch 112W that extends axially into and out of the plane of the drawing page of FIG. 29 for a distance that corresponds approximately to the axial length (in the gate width direction of the transistor devices) of the conductive source/drain contact structure 120 posited adjacent the spacer 112. As noted above, in the depicted example, the notch 112W is defined by a tapered surface 112Z and a substantially horizontally oriented bottom surface 112X. The spacer 112S has a tapered portion 112Y and an upper surface 112T. In one illustrative example, a portion of the insulating source/drain cap structure 125A is positioned within the notch 112W, wherein the surfaces 125H and 112Z engage and physically contact one another and the surfaces 125I and 112X engage and physically contact one another. The illustrative spacer 112S comprises an inner surface 112H positioned adjacent the gate structure 108-2 and an outer surface 112J. The tapered portion 112Y of the spacer 112S is positioned between a portion of the CB gate contact structure 130 and the portion of the insulating source/drain cap structure 125A positioned in the notch 112W. A portion of the CB gate contact structure 130 is also positioned vertically above the notch 112W. Also note that the portion of the insulating source/drain cap structure 125A positioned in the notch 112W in the spacer 112S is positioned vertically between the CB contact structure 130 and the spacer 112S.

Figure 30:
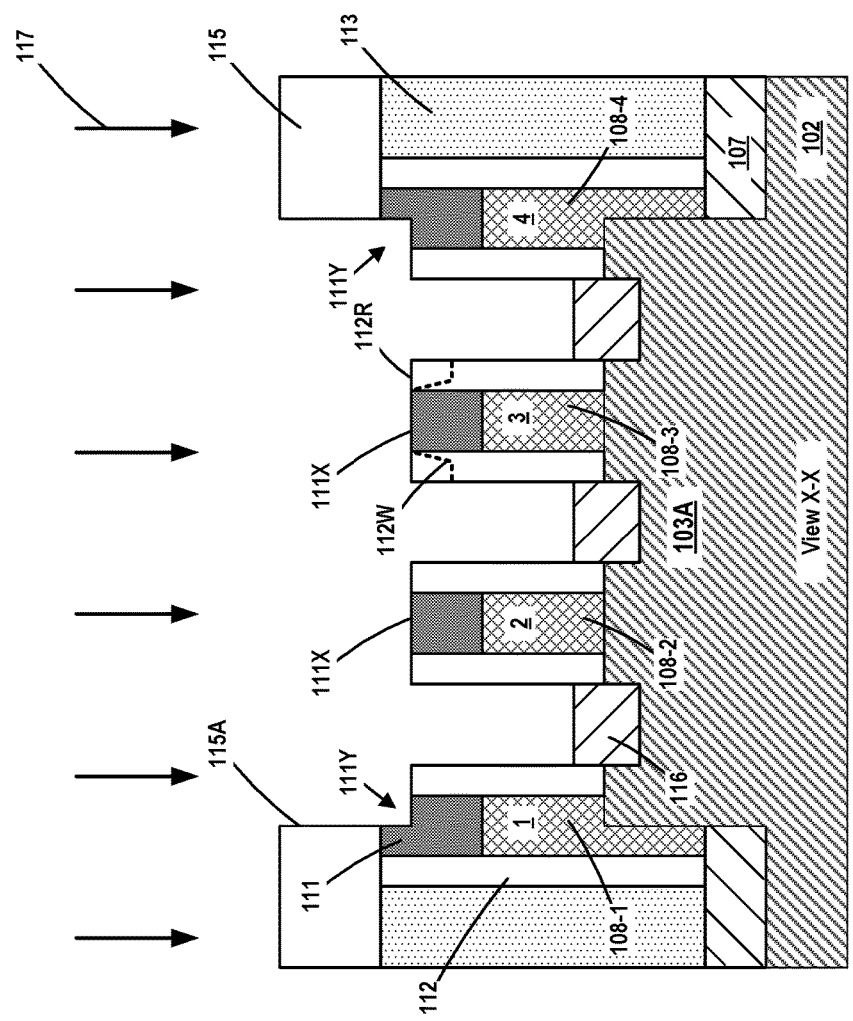
FIGS. 30-41 depict other various embodiments of a gate contact structure that is positioned above an active region of a transistor device and various methods of making such a gate contact structure.
Figure 31:
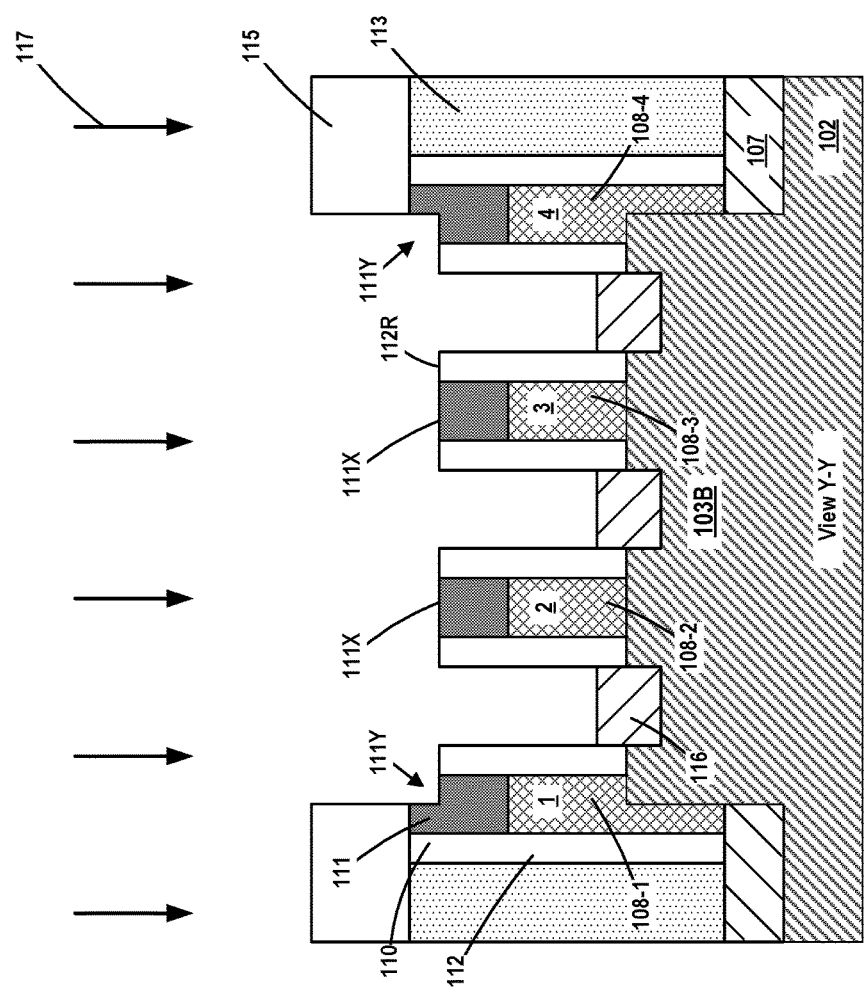

FIGS. 30-41 depict other various embodiments of a gate contact structure that is positioned above an active region of a transistor device and various methods of making such a gate contact structure. After the point of processing shown in FIGS. 3 and 4, FIGS. 30 and 31 depict the IC product 100 after several processing operations were performed. More specifically, FIGS. 30 and 31 depict the product 100 after the above-described patterned etch mask 115 was formed on the product 100. Thereafter, an etching process 117 was performed on the product 100. Like the above-described etching process 114, the etching process 117 is primarily designed to remove the portions of the layer of insulating material 113 positioned above the epi semiconductor material 116 in the source/drain regions of the transistor devices and thereby expose the source/drain regions of the transistors. As before, the exposed portion of the gate caps 111, the sidewall spacers 112 and the layer of insulating material 113 are all subjected to this common etching process 117. However, relative to the previous embodiment, in this embodiment, the etching process 117 is performed such that there is little to no erosion of the upper portion of the spacers 112. More specifically, during the etch process 117, the above-described notch 112W (shown in dashed lines on two representative spacers 112 positioned adjacent the gate 108-3) is not formed in the exposed spacers 112.

Figure 32:
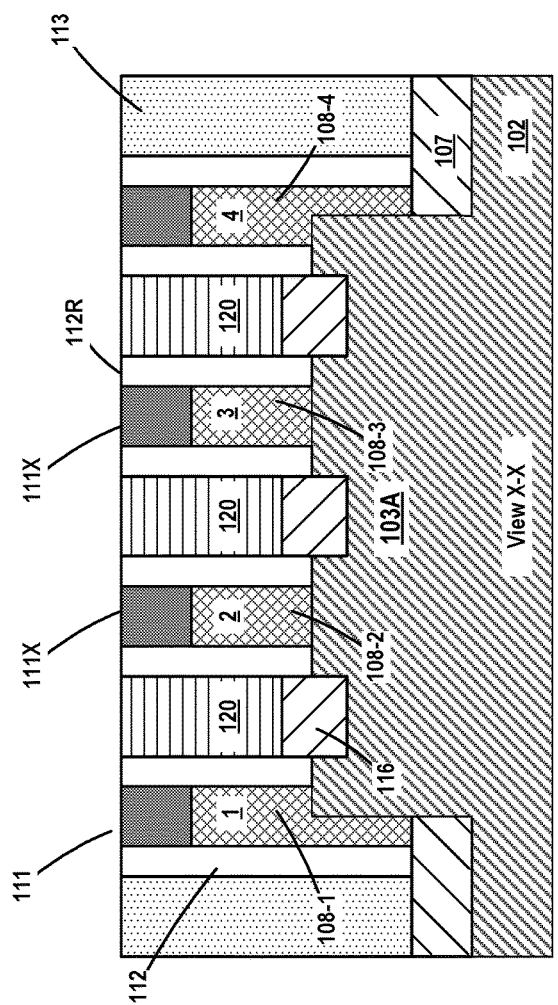
Figure 33:
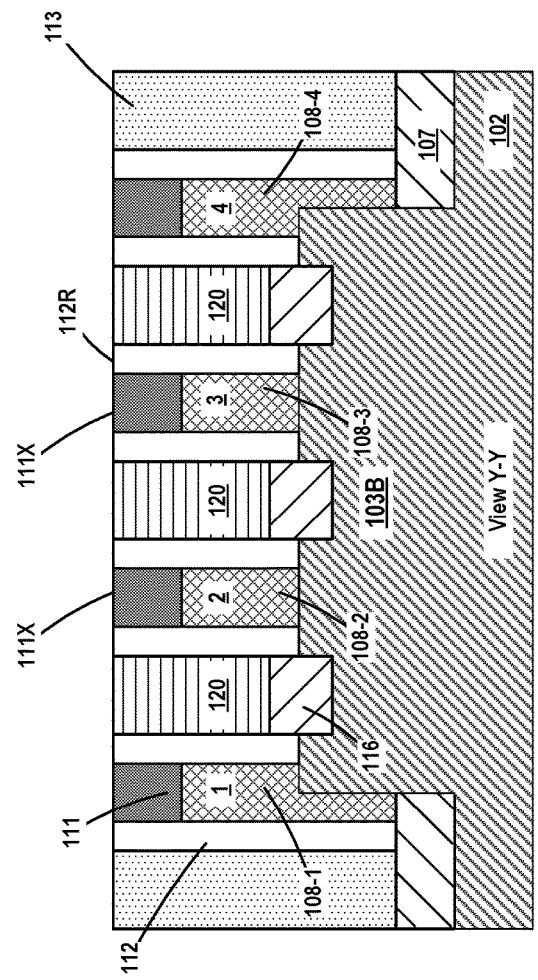

FIGS. 32 and 33 depict the IC product 100 after several process operations were performed. First, the patterned etch mask 115 was removed. Then, the above-described source/drain contact structures 120 (e.g., trench silicide structures) were formed on the product using the techniques described above in connection with FIGS. 6 and 7.

Figure 34:
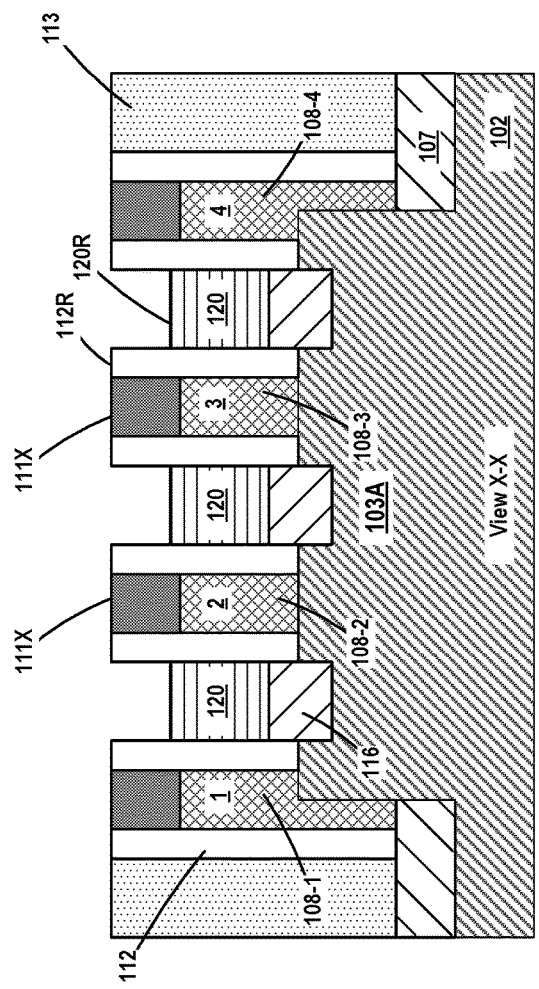
Figure 35:
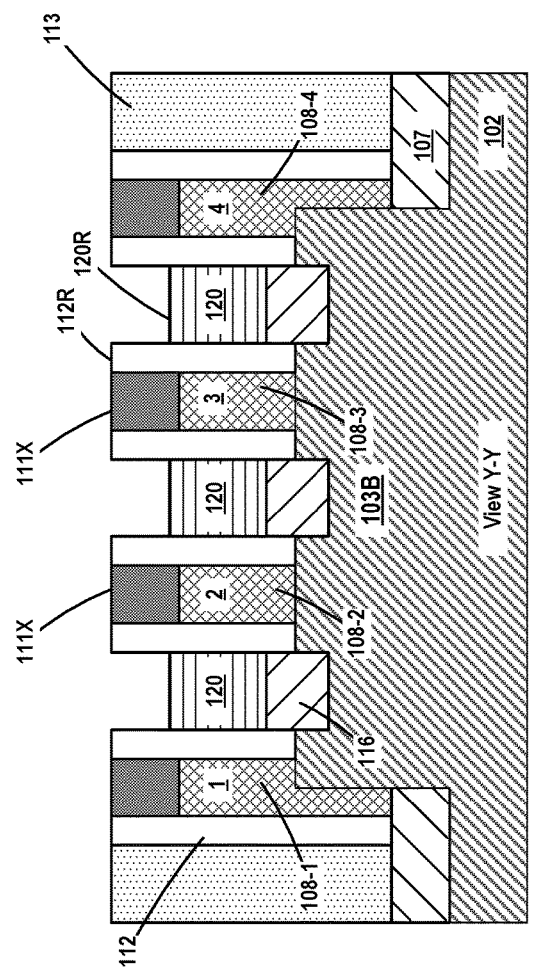

FIGS. 34 and 35 depict the IC product 100 after one or more recess etching processes were performed to recess the conductive source/drain contact structures 120 using the techniques described above in connection with FIGS. 8 and 9.

Figure 36:
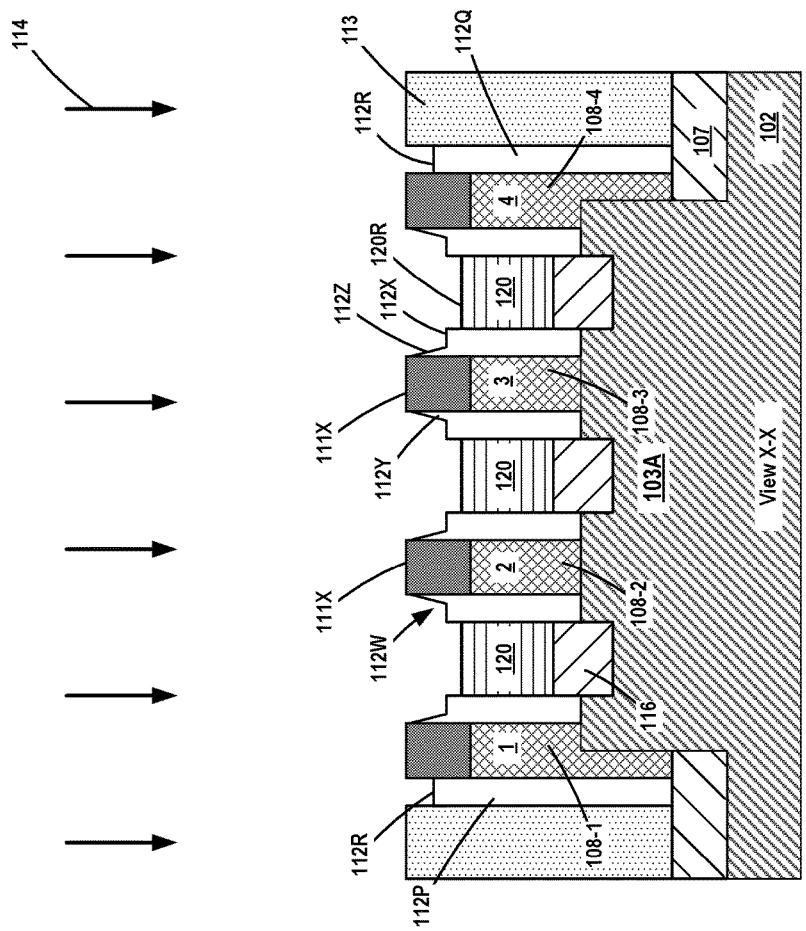
Figure 37:
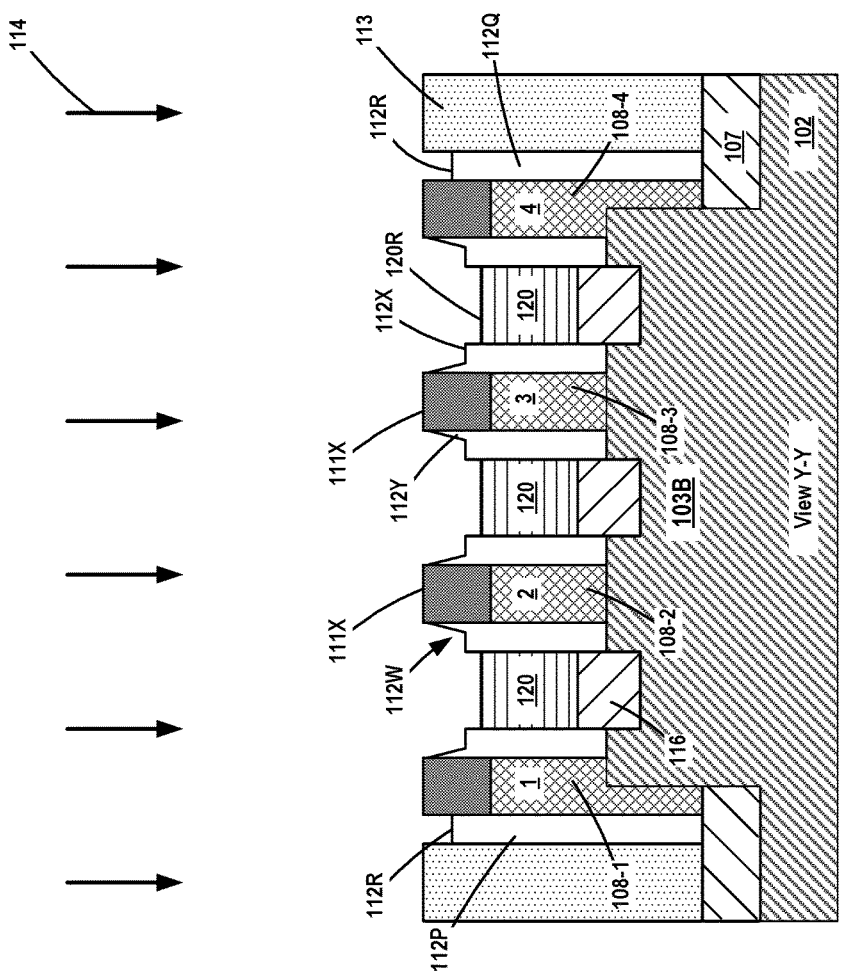

FIGS. 36 and 37 depict the IC product 100 after the above-described spacer etching process 114 was performed on the product. However, unlike the previous embodiment, all of the spacers 112 are subjected to the etching process 114, including the two outermost spacers 112P and 112Q. As before, performing the etching process 114 results in the formation of the above-described notch 112W in the spacers 112 positioned adjacent the conductive source/drain contact structures 120. However, since only the upper surface of the outermost spacers 112P and 112Q is exposed to the etching process 114, they have a substantially planar recessed upper surface 112R at the completion of the etching process 114. In general, the recessed surface 112R of the spacers 112P and 112Q will be at a level that is slightly above (e.g., 0.5-5 nm) the substantially horizontally oriented surfaces 112X of the other spacers 112 positioned adjacent the conductive source/drain contact structures 120.

Figure 38:
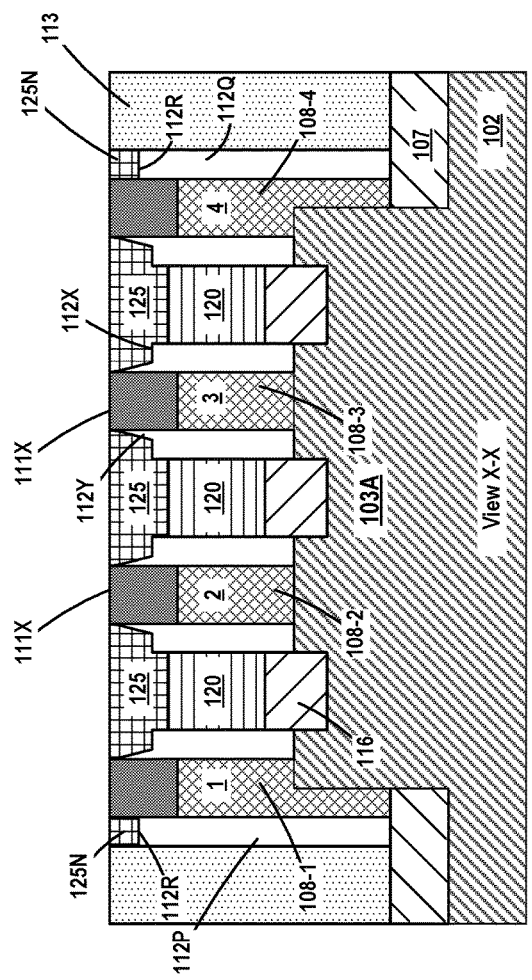
Figure 39:
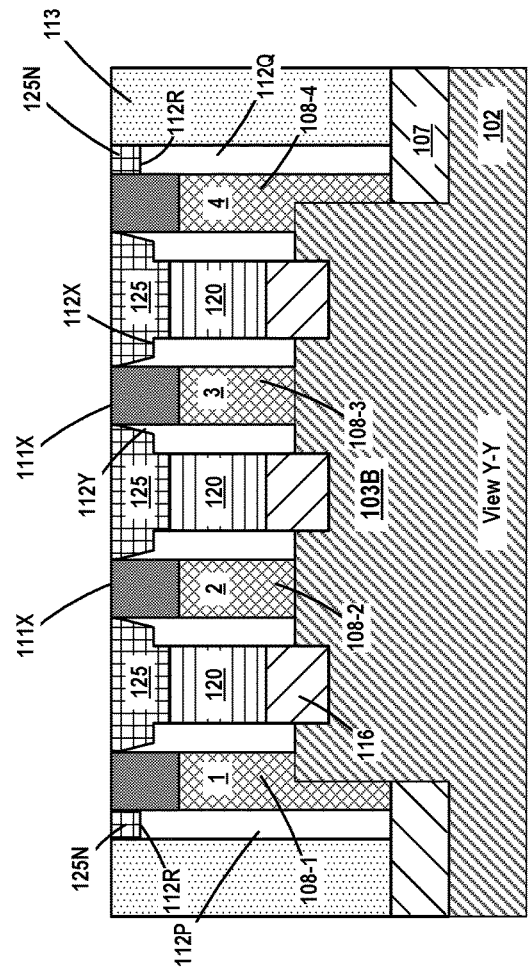

FIGS. 38 and 39 depict the IC product 100 after the above-described insulating source/drain cap structures 125 were formed in the cavities located above the recessed conductive source/drain contact structures 120 using the techniques described above in connection with FIGS. 10 and 11. However, in this embodiment, portions of the material used for the insulating source/drain cap structures 125, as reflected by the reference numeral 125N, is also formed in the cavity above the recessed upper surface 112R of the recessed outermost spacers 112P and 112Q.

Figure 40:
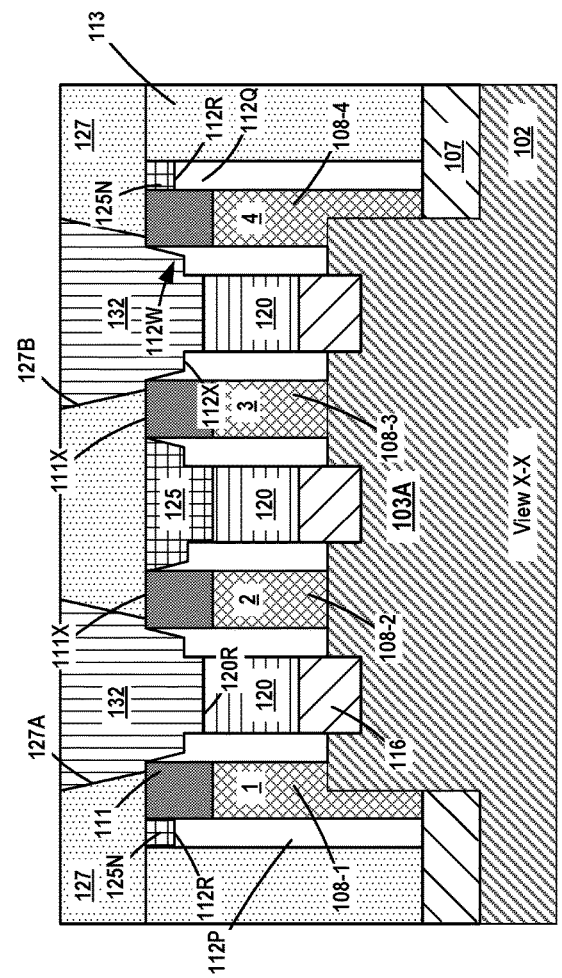
Figure 41:
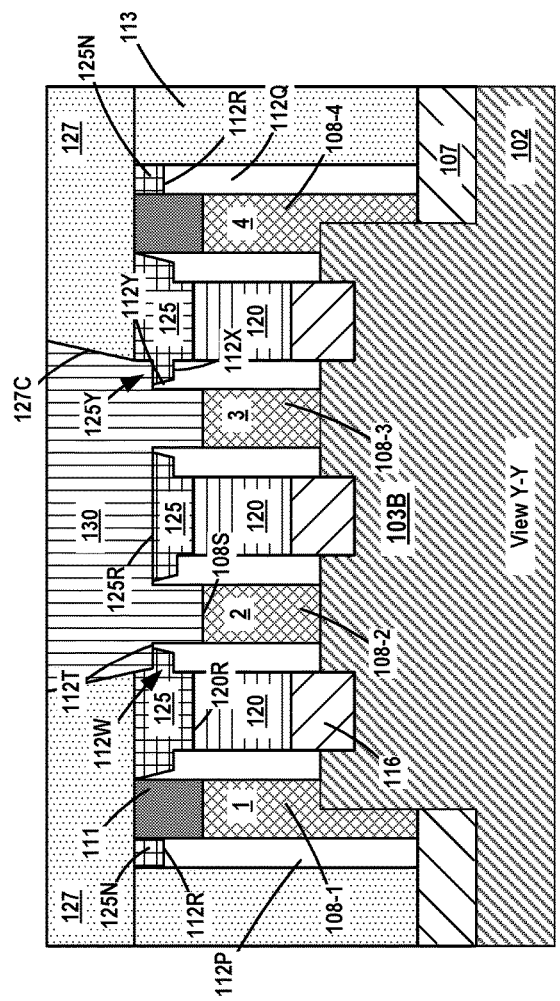

FIGS. 40 and 41 depict the IC product 100 after the various process operations described above in connection with FIGS. 12-24 were performed to form the above-described CB gate contact structure 130 and the CA contact structures 132 for the transistor devices.

One illustrative integrated circuit product disclosed herein includes a gate structure 108 for a transistor, a conductive source/drain contact structure 120 and an insulating source/drain cap structure 125A positioned above the conductive source/drain contact structure 120, wherein a first notch 125Y is formed in the insulating source/drain cap structure 125A. In one illustrative example, the product also includes a sidewall spacer 112, a portion (below the notch 112W) of which is positioned laterally between the gate structure 108 and the conductive source/drain contact structure 120. A second notch 112W is formed in an upper portion of the sidewall spacer 112. A first portion of the insulating source/drain cap structure 125A is positioned in the second notch 112W. In this example, a first portion of the conductive gate contact structure 130 is positioned in the first notch 125Y while a second portion of the conductive gate contact structure 130 is in contact with the gate structure 108.

Another illustrative integrated circuit product disclosed herein includes a gate structure 108 for a transistor, a conductive source/drain contact structure 120 and an insulating source/drain cap structure 125A positioned above the conductive source/drain contact structure 120. The insulating source/drain cap structure 125A has a first notch 125Y formed therein. In this example, the product also includes a sidewall spacer 112, a lower portion of which is positioned laterally between the gate structure 108 and the conductive source/drain contact structure 120, wherein a second notch 112W is formed in the upper portion of the sidewall spacer 112. A first portion of the insulating source/drain cap structure 125A is positioned in the second notch 112W and physically contacts the sidewall spacer 112. In this embodiment, a first portion of the conductive gate contact structure 130 is positioned in the first notch 125Y and physically contacts the insulating source/drain cap structure 125A while a second portion of the conductive gate contact structure 130 is in contact with an upper surface of the gate structure. In this example, a tapered portion 112Y of the sidewall spacer 112 is positioned laterally between a part of the conductive gate contact structure 130 and a part of the insulating source/drain cap structure 125A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a gate structure for a transistor;
   a conductive source/drain contact structure;
   an insulating source/drain cap structure positioned above said conductive source/drain contact structure, said insulating source/drain cap structure comprising a first notch;
   a sidewall spacer, a portion of which is positioned laterally between said gate structure and said conductive source/drain contact structure, said sidewall spacer comprising a second notch in an upper portion of said sidewall spacer, wherein a first portion of said insulating source/drain cap structure is positioned in said second notch; and
   a conductive gate contact structure comprising first and second portions, said first portion of said conductive gate contact structure being positioned in said first notch, said second portion of said conductive gate contact structure being in contact with said gate structure.

2. The integrated circuit product of claim 1, wherein said sidewall spacer comprises a tapered portion that is positioned laterally between a part of said conductive gate contact structure and a part of said insulating source/drain cap structure.

3. The integrated circuit product of claim 1, wherein, when said insulating source/drain cap structure is viewed in a cross-section taken in a direction corresponding to a gate length direction of said transistor, said first notch is defined, at least in part, by an upper surface connected by a first tapered surface to a first substantially horizontally oriented surface positioned at a first height less than a second height of said upper surface.

4. The integrated circuit product of claim 3, wherein said first portion of said conductive gate contact structure physically contacts said first tapered surface and said first substantially horizontally oriented surface.

5. The integrated circuit product of claim 1, wherein, when said sidewall spacer is viewed in a cross-section taken in a direction corresponding to a gate length direction of said transistor, said second notch is defined, at least in part, by an upper surface, a second tapered surface extending between said upper surface and a second substantially horizontally oriented surface positioned at a first height less than a second height of said upper surface.

6. The integrated circuit product of claim 5, wherein said first portion of said insulating source/drain cap structure physically contacts said second tapered surface and said second substantially horizontally oriented surface.

7. The integrated circuit product of claim 5, wherein said first portion of said insulating source/drain cap structure is positioned vertically between said first portion of said conductive gate contact structure and said second substantially horizontally oriented surface.

8. The integrated circuit product of claim 1, wherein said first notch is positioned vertically above an active region of said transistor.

9. The integrated circuit product of claim 1, wherein said conductive gate contact structure is conductively coupled to a gate structure of at least one additional transistor.

10. The integrated circuit product of claim 1, wherein said transistor is a FinFET transistor.

11. The integrated circuit product of claim 1, further comprising a gate cap positioned above said gate structure, wherein said gate cap is comprised of a first material and said sidewall spacer is comprised of a second material that is different than said first material, wherein, when subjected to a common etching process, said first material has a first etch rate and said second material has a second etch rate, said second etch rate being greater than said first etch rate.

12. The integrated circuit product of claim 11, wherein said first material is silicon nitride and said second material is silicon carbon nitride (SiCoN).

13. The integrated circuit product of claim 1, wherein said sidewall spacer physically contacts both said gate structure and said conductive source/drain contact structure.

14. An integrated circuit product, comprising:
  a gate structure for a transistor;
  a conductive source/drain contact structure;
  an insulating source/drain cap structure positioned above said conductive source/drain contact structure, said insulating source/drain cap structure comprising a first notch;
  a sidewall spacer, a portion of which is positioned laterally between said gate structure and said conductive source/drain contact structure, said sidewall spacer comprising a second notch in an upper portion of said sidewall spacer that is at least partially defined by a tapered portion, wherein a first portion of said insulating source/drain cap structure is positioned in said second notch and physically contacts said sidewall spacer; and
  a conductive gate contact structure comprising first and second portions, wherein said first portion of said conductive gate contact structure is positioned in said first notch and physically contacts said insulating source/drain cap structure, said second portion of said conductive gate contact structure is in contact with an upper surface of said gate structure and wherein said tapered portion of said sidewall spacer is positioned laterally between a part of said conductive gate contact structure and a part of said insulating source/drain cap structure.

15. The integrated circuit product of claim 14, wherein, when said insulating source/drain cap structure is viewed in a cross-section taken in a direction corresponding to a gate length direction of said transistor, said first notch is defined, at least in part, by an upper surface connected by a first tapered surface to a first substantially horizontally oriented surface positioned at a first height less than a second height of said upper surface.

16. The integrated circuit product of claim 15, wherein said first portion of said conductive gate contact structure physically contacts said first tapered surface and said first substantially horizontally oriented surface.

17. The integrated circuit product of claim 14, wherein, when said sidewall spacer is viewed in a cross-section taken in a direction corresponding to a gate length direction of said transistor, said second notch is defined, at least in part, by an upper surface, a second tapered surface extending between said upper surface and a second substantially horizontally oriented surface positioned at a first height less than a second height of said upper surface.

18. The integrated circuit product of claim 17, wherein said first portion of said insulating source/drain cap structure physically contacts said second tapered surface and said second substantially horizontally oriented surface.

19. The integrated circuit product of claim 14, wherein said first portion of said insulating source/drain cap structure is positioned vertically between said first portion of said conductive gate contact structure and a substantially horizontally oriented surface that at least partially defines said second notch.

20. The integrated circuit product of claim 14, wherein said first notch is positioned vertically above an active region of said transistor.

* * * * *